US 012068255B2

(12) United States Patent
Barclay et al.

(10) Patent No.: US 12,068,255 B2
(45) Date of Patent: Aug. 20, 2024

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: M. Jared Barclay, Middleton, ID (US); John D. Hopkins, Meridian, ID (US); Richard J. Hill, Boise, ID (US); Indra V. Chary, Boise, ID (US); Kar Wui Thong, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 384 days.

(21) Appl. No.: 17/399,283

(22) Filed: Aug. 11, 2021

(65) Prior Publication Data

US 2023/0052468 A1  Feb. 16, 2023

(51) Int. Cl.
*H10B 43/27* (2023.01)
*H01L 21/768* (2006.01)
(Continued)

(52) U.S. Cl.
CPC ...... *H01L 23/535* (2013.01); *H01L 21/76805* (2013.01); *H01L 21/76895* (2013.01); *H10B 41/27* (2023.02); *H10B 43/27* (2023.02)

(58) Field of Classification Search
CPC ............. H01L 23/535; H01L 21/76805; H01L 21/76895; H10B 41/27; H10B 43/27
See application file for complete search history.

(56) References Cited

U.S. PATENT DOCUMENTS 9,461,063 B1  10/2016  Lai et al.
10,014,309 B2  7/2018  Dorhout et al.
(Continued)

FOREIGN PATENT DOCUMENTS

CN  109712987  5/2019
TW  202036856  10/2020
(Continued)

OTHER PUBLICATIONS

U.S. Appl. No. 17/231,895, filed Apr. 15, 2021, by Chandolu et al.
(Continued)

*Primary Examiner* — Ratisha Mehta
*Assistant Examiner* — Brad A Knudson
(74) *Attorney, Agent, or Firm* — Wells St. John P.S.

(57) ABSTRACT

A memory array comprising strings of memory cells comprises laterally-spaced memory blocks individually comprising a vertical stack comprising alternating insulative tiers and conductive tiers above a conductor tier. Strings of memory cells comprise channel-material strings that extend through the insulative tiers and the conductive tiers. The channel-material strings directly electrically couple with conductor material of the conductor tier by conducting material that is in a lowest of the conductive tiers and that is directly against multiple of the channel-material strings. The channel-material strings in the laterally-spaced memory blocks comprise part of a memory plane. A wall in the lowest conductive tier is aside the conducting material. The wall is in a region that is edge-of-plane relative to the memory plane. The edge-of-plane region comprises a TAV region. The wall is horizontally-elongated relative to an edge of the TAV region that is in the edge-of-plane region. Other memory arrays and methods are disclosed.

36 Claims, 39 Drawing Sheets

(51) Int. Cl.
*H01L 23/535* (2006.01)
*H10B 41/27* (2023.01)

(56) References Cited

U.S. PATENT DOCUMENTS

| | | |
|---|---|---|
| 10,347,654 B1 | 7/2019 | Iwai et al. |
| 2018/0006052 A1 | 1/2018 | Hwang |
| 2018/0122904 A1 | 5/2018 | Matsumoto et al. |
| 2019/0280001 A1 | 9/2019 | Terasawa et al. |
| 2020/0051997 A1 | 2/2020 | Park |
| 2020/0127004 A1 | 4/2020 | Dorhout et al. |
| 2020/0135749 A1 | 4/2020 | Hwang et al. |
| 2020/0168622 A1 | 5/2020 | Fukuzumi et al. |
| 2020/0295033 A1 | 9/2020 | Sakamoto et al. |
| 2020/0402905 A1* | 12/2020 | Otsu .................. H10B 43/40 |
| 2021/0057441 A1 | 2/2021 | Xu et al. |
| 2021/0151460 A1* | 5/2021 | Kim .................. H10B 43/40 |
| 2021/0217761 A1 | 7/2021 | Tiwari |
| 2022/0199767 A1 | 6/2022 | Lee et al. |

FOREIGN PATENT DOCUMENTS

| | | |
|---|---|---|
| WO | WO PCT/US2022/036456 | 11/2022 |
| WO | WO PCT/US2022/036456 | 2/2024 |

OTHER PUBLICATIONS

U.S. Appl. No. 17/508,143, filed Oct. 22, 2021, by Scarbrough et al.
U.S. Appl. No. 17/398,188, filed Aug. 10, 2021, by Scarbrough et al.
U.S. Appl. No. 17/409,300, filed Aug. 23, 2021, by Scarbrough et al.
U.S. Appl. No. 17/409,355, filed Aug. 23, 2021, by Scarbrough et al.

* cited by examiner

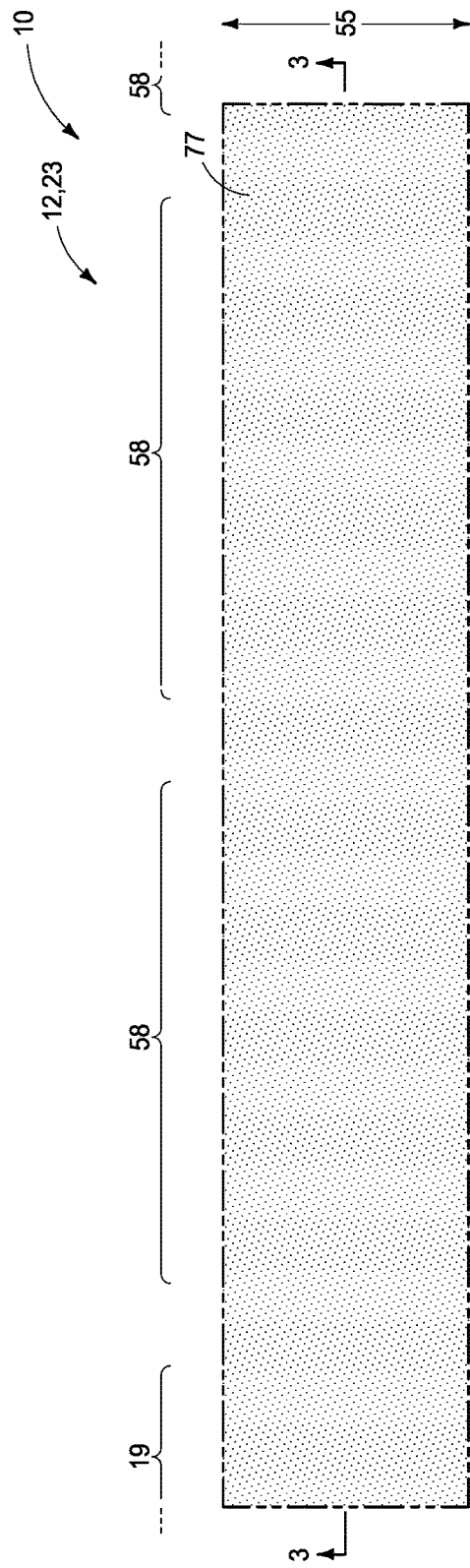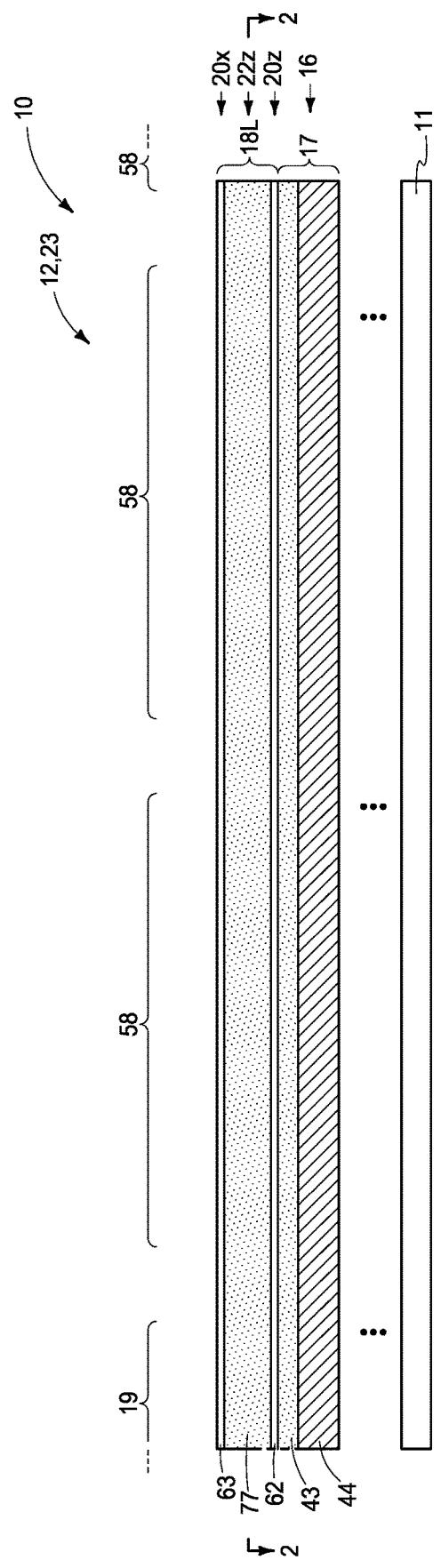

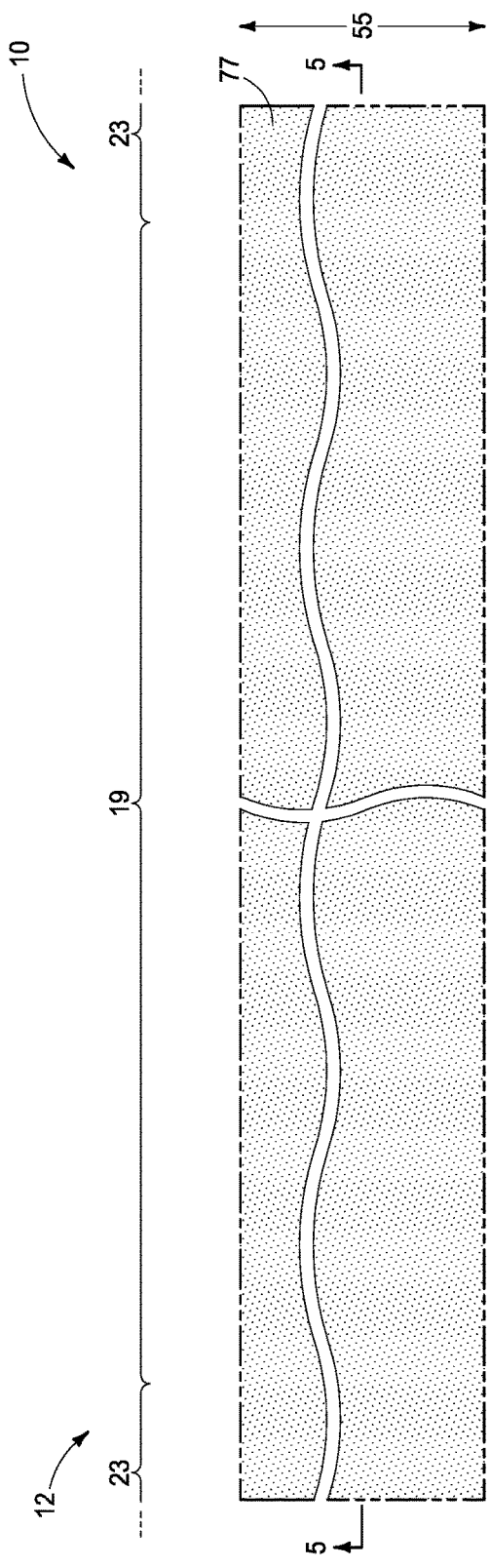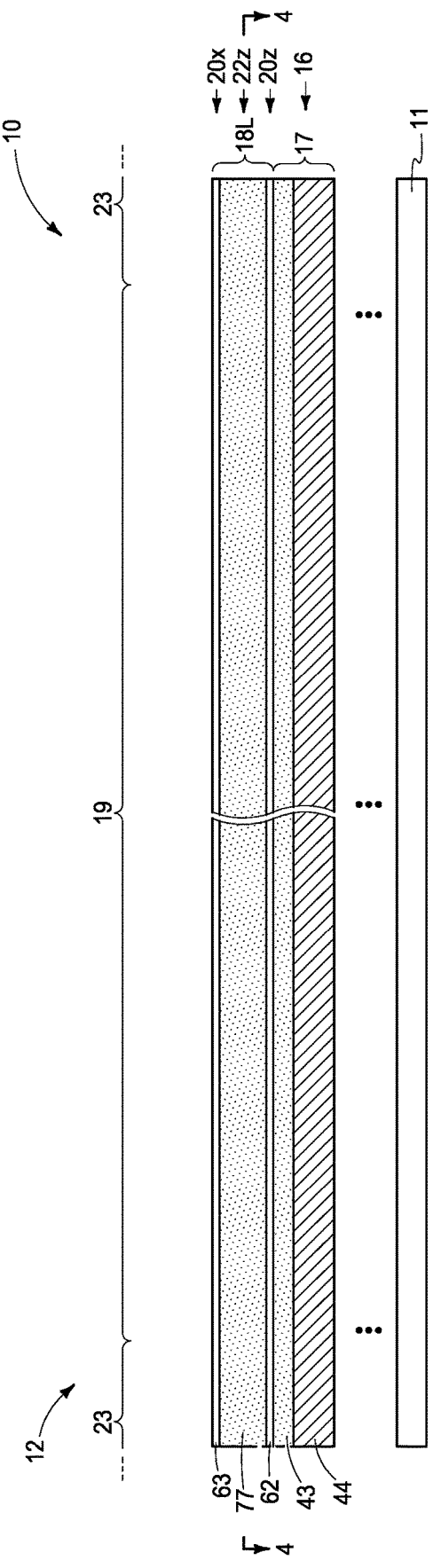

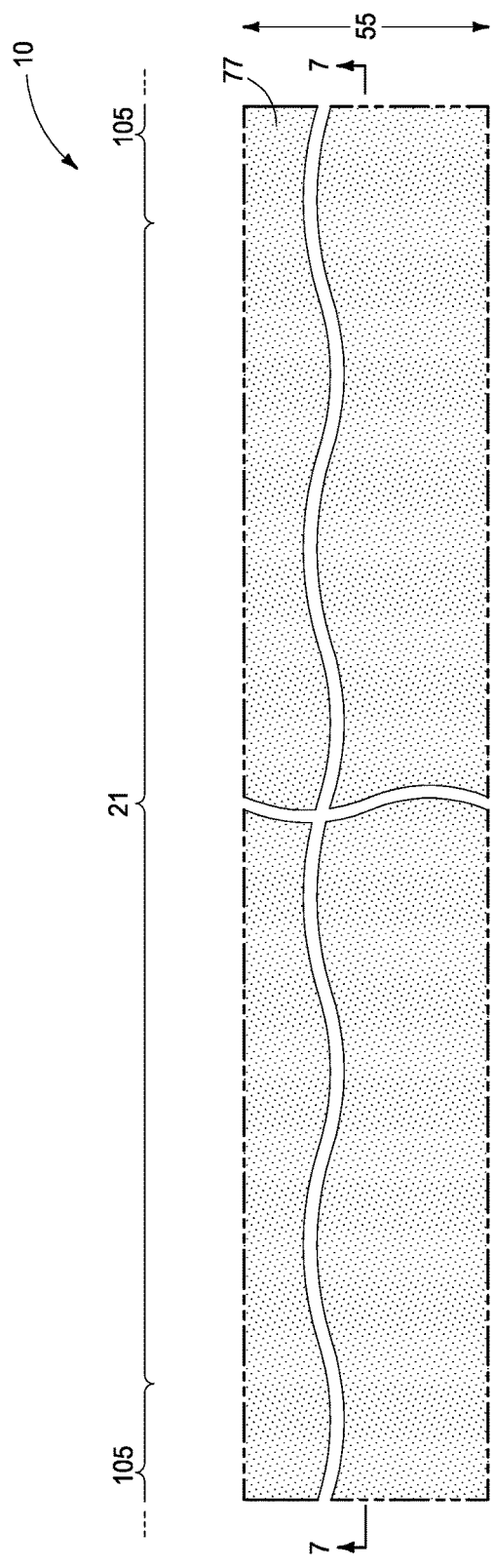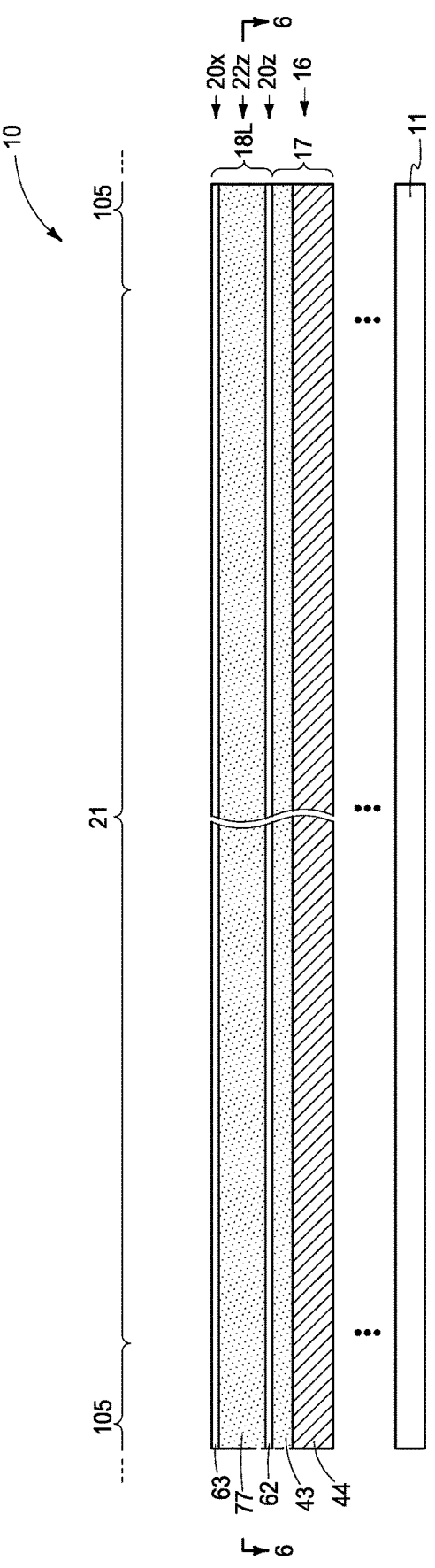

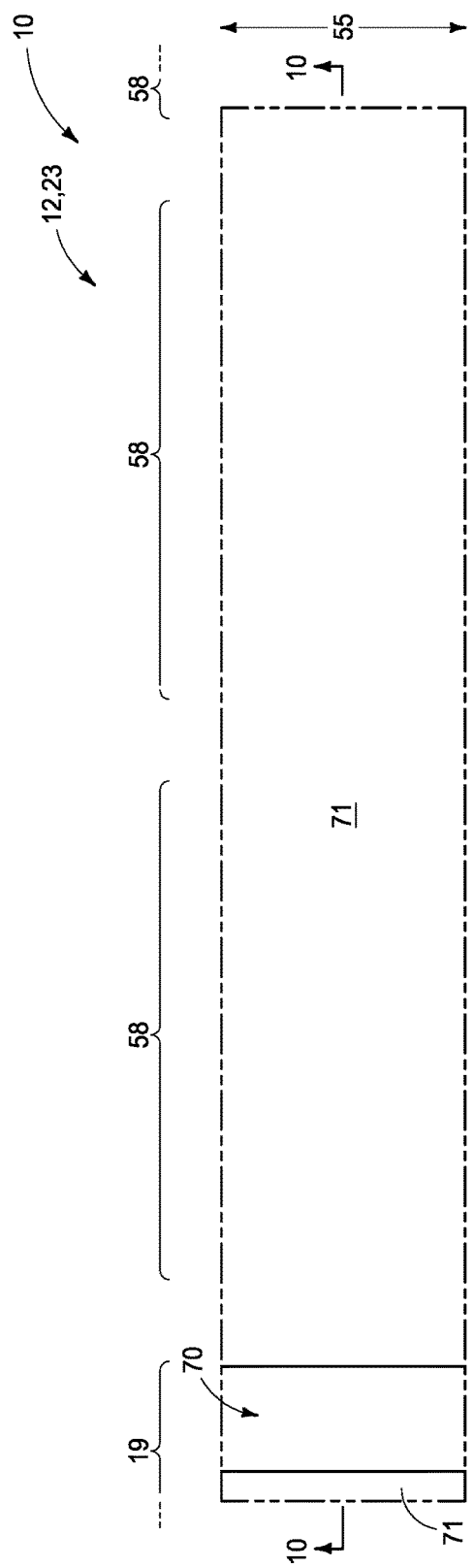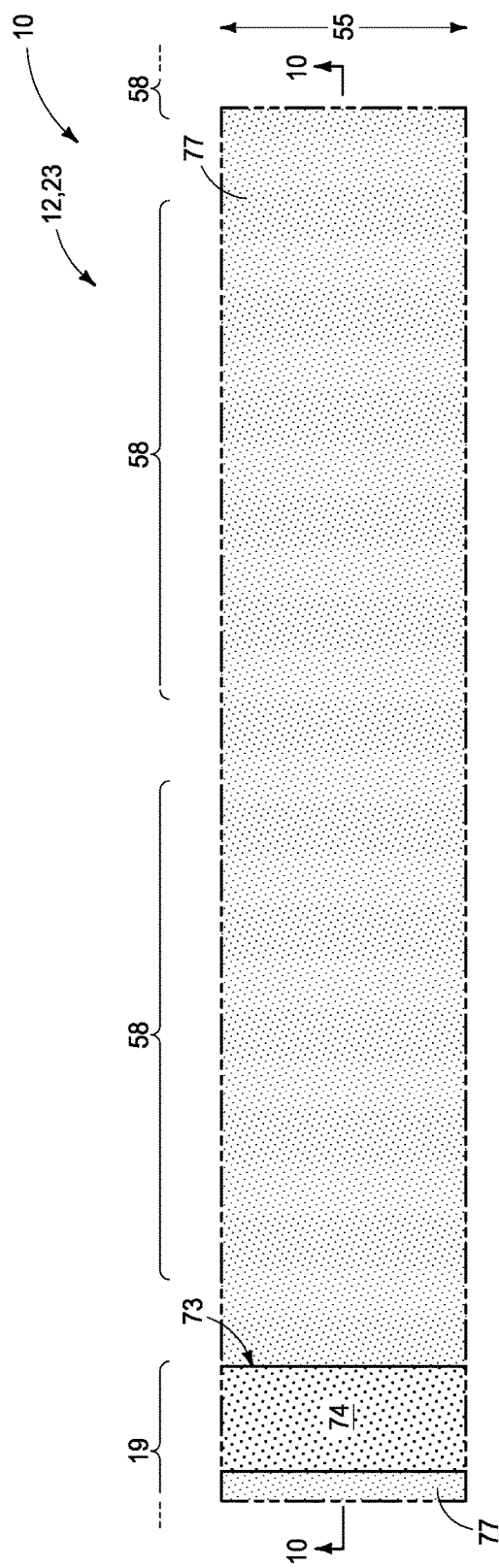

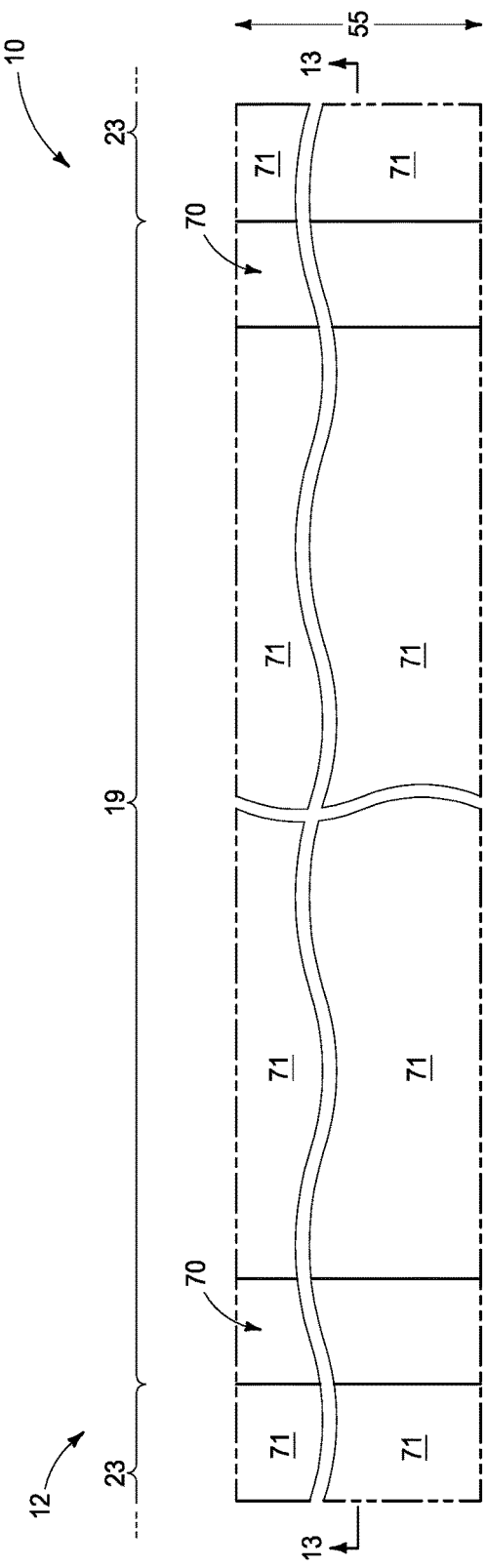
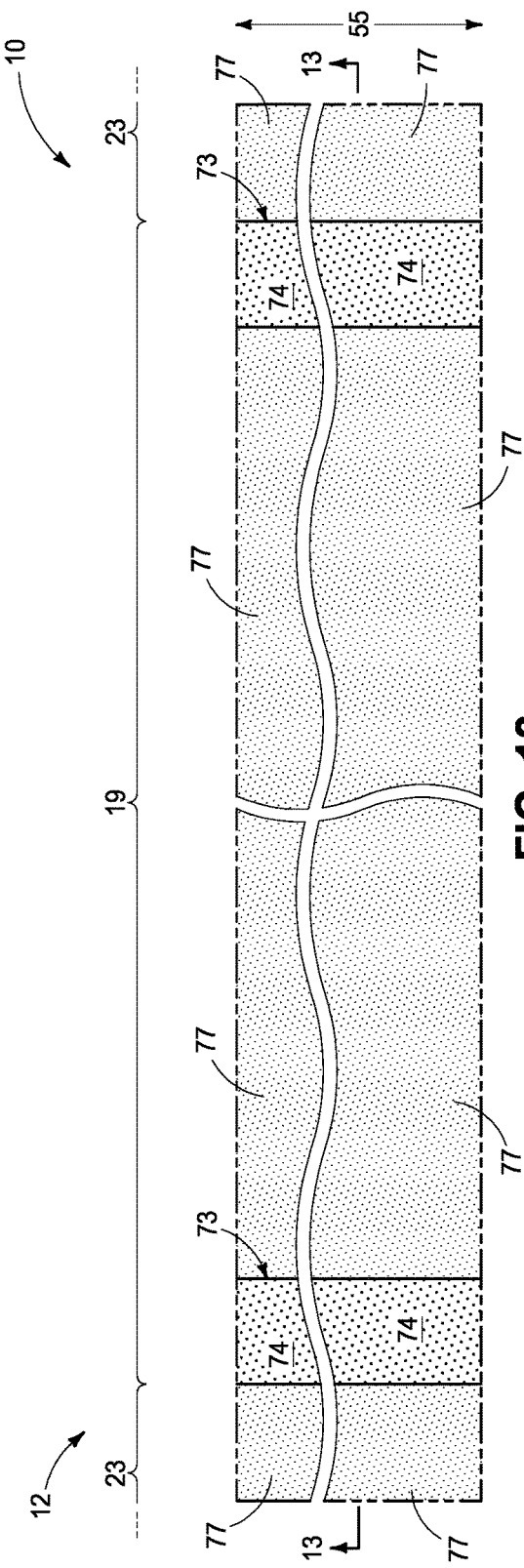

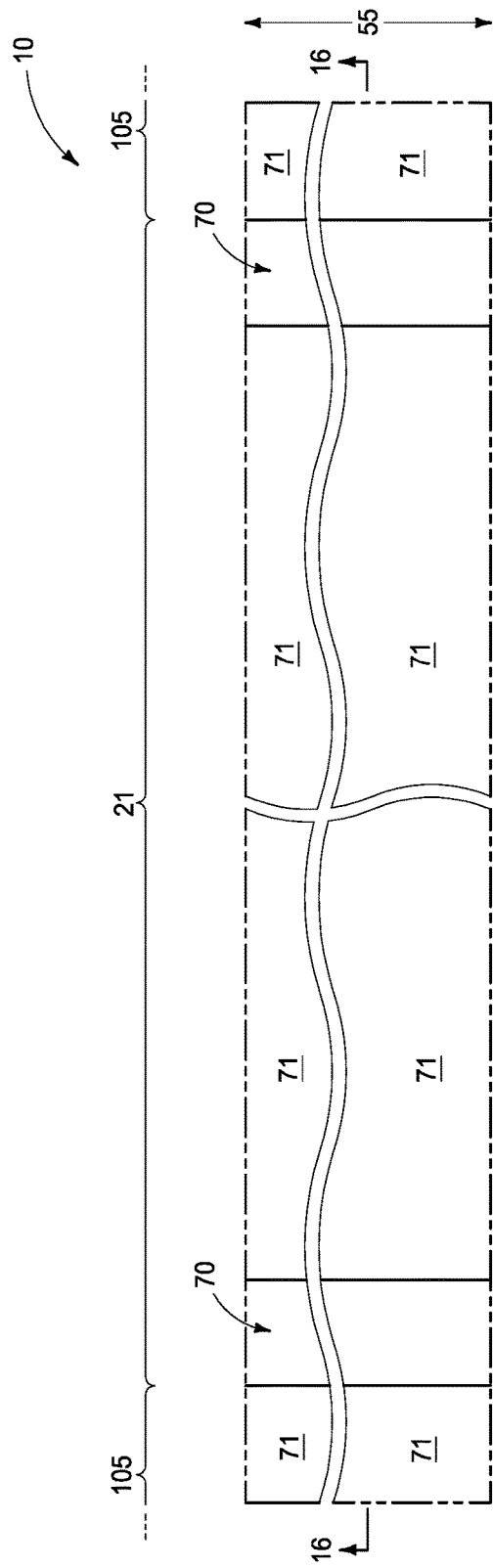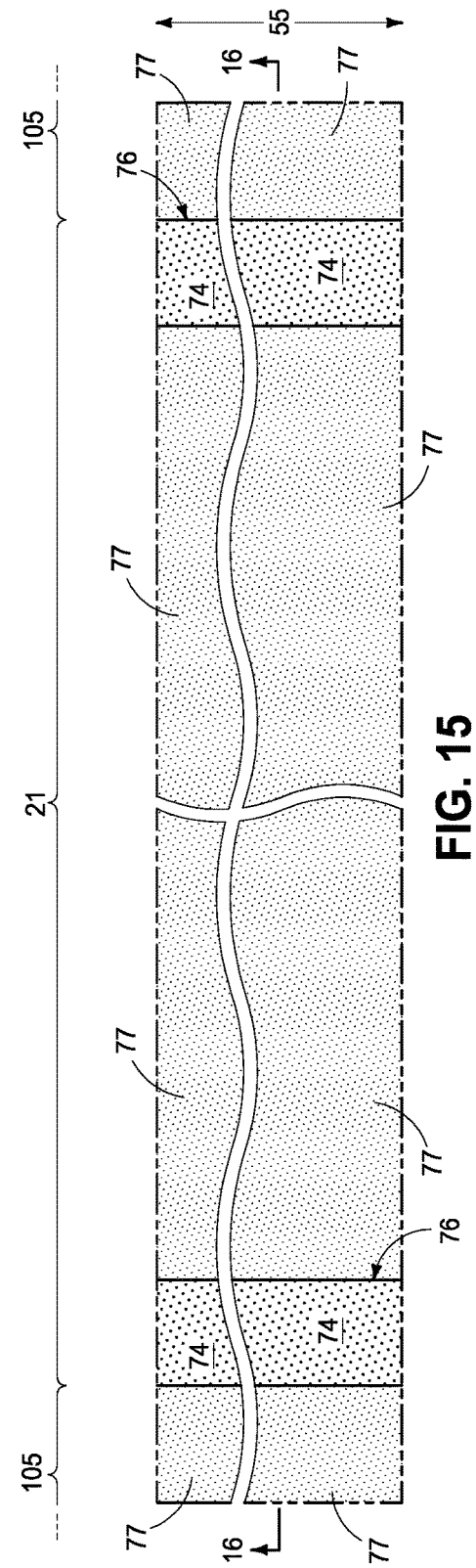

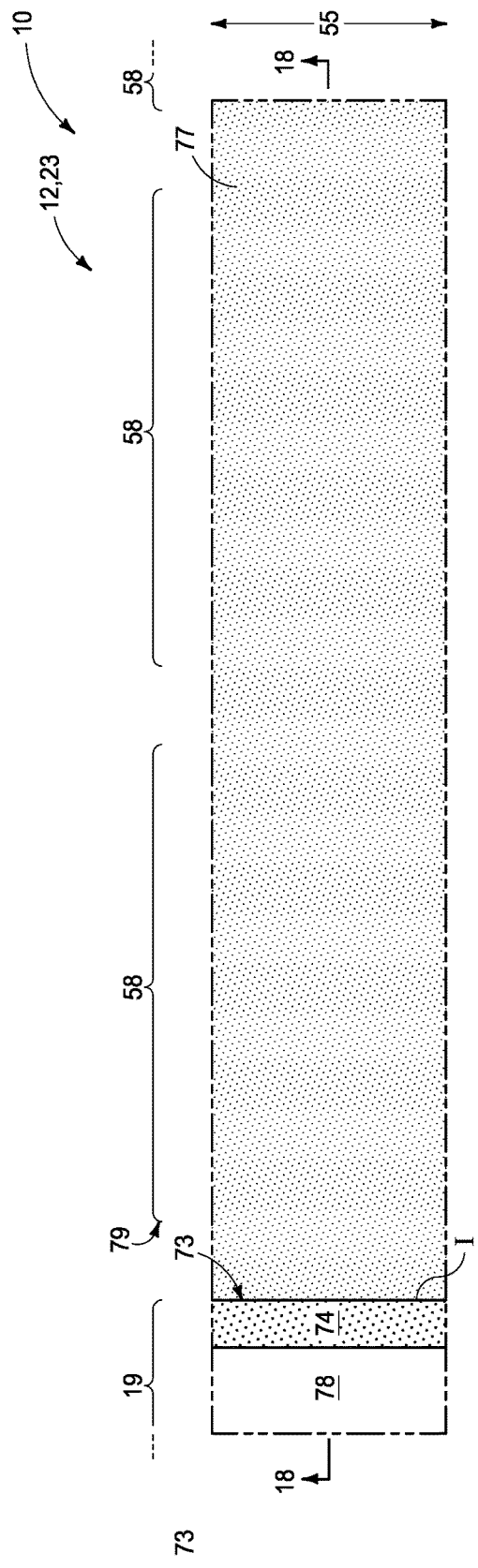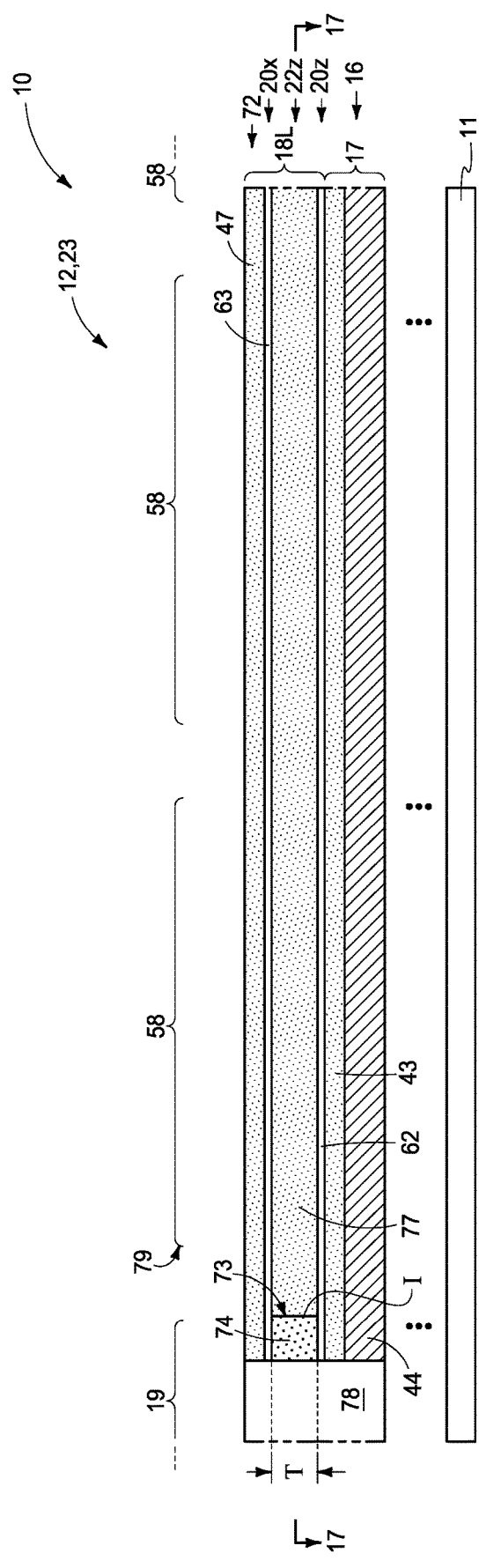

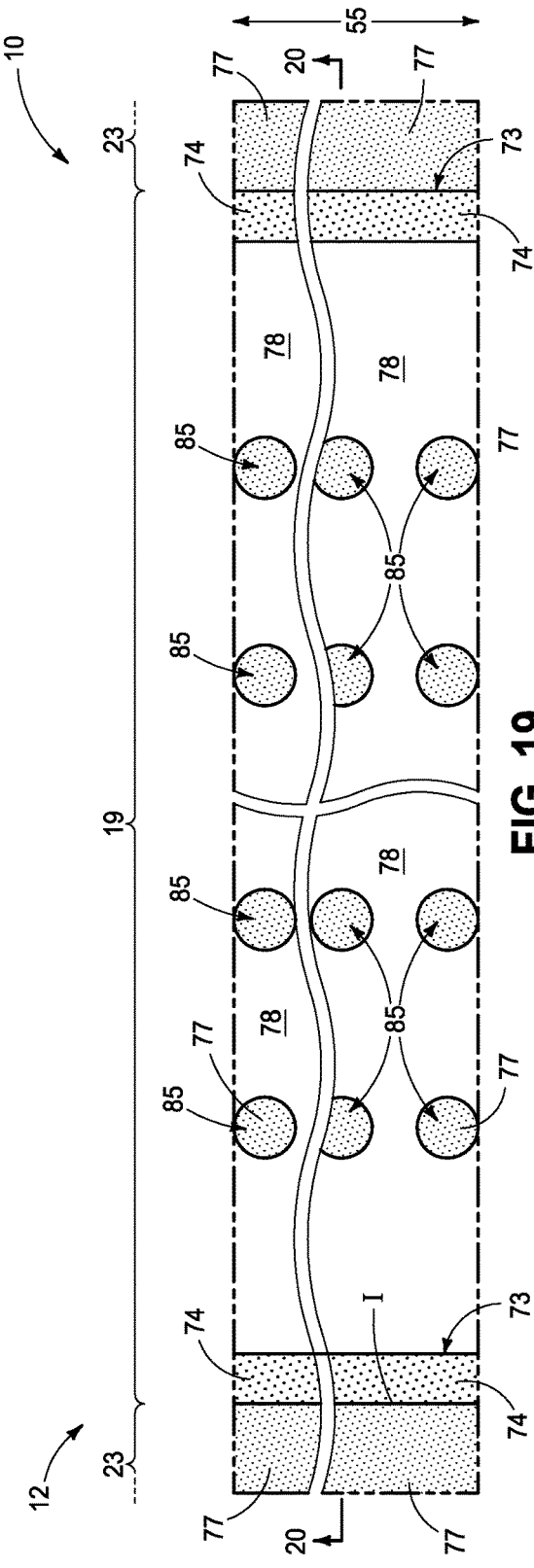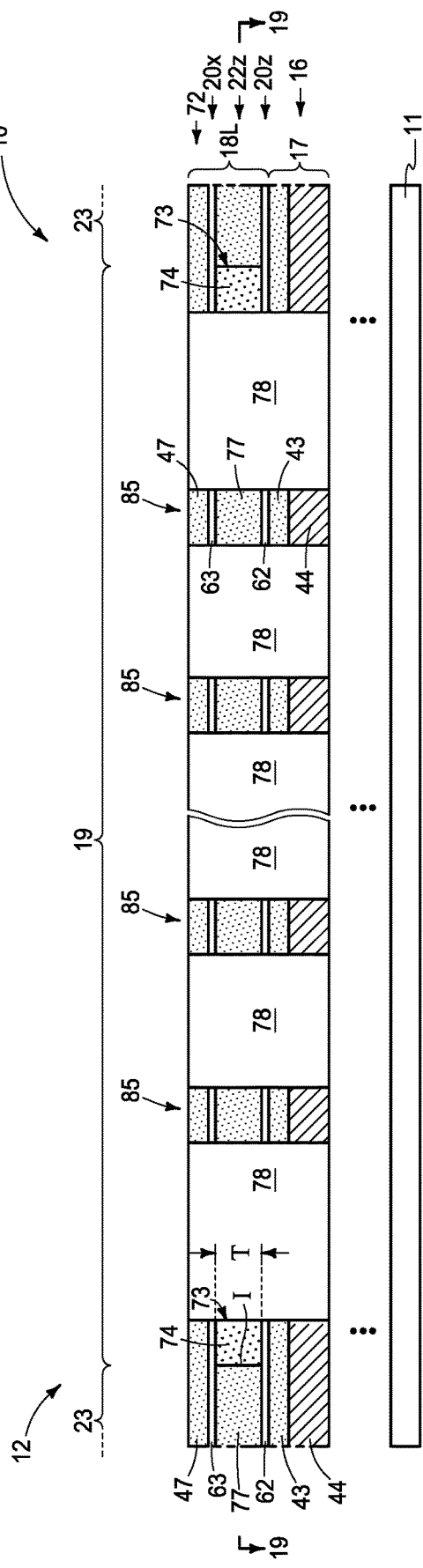

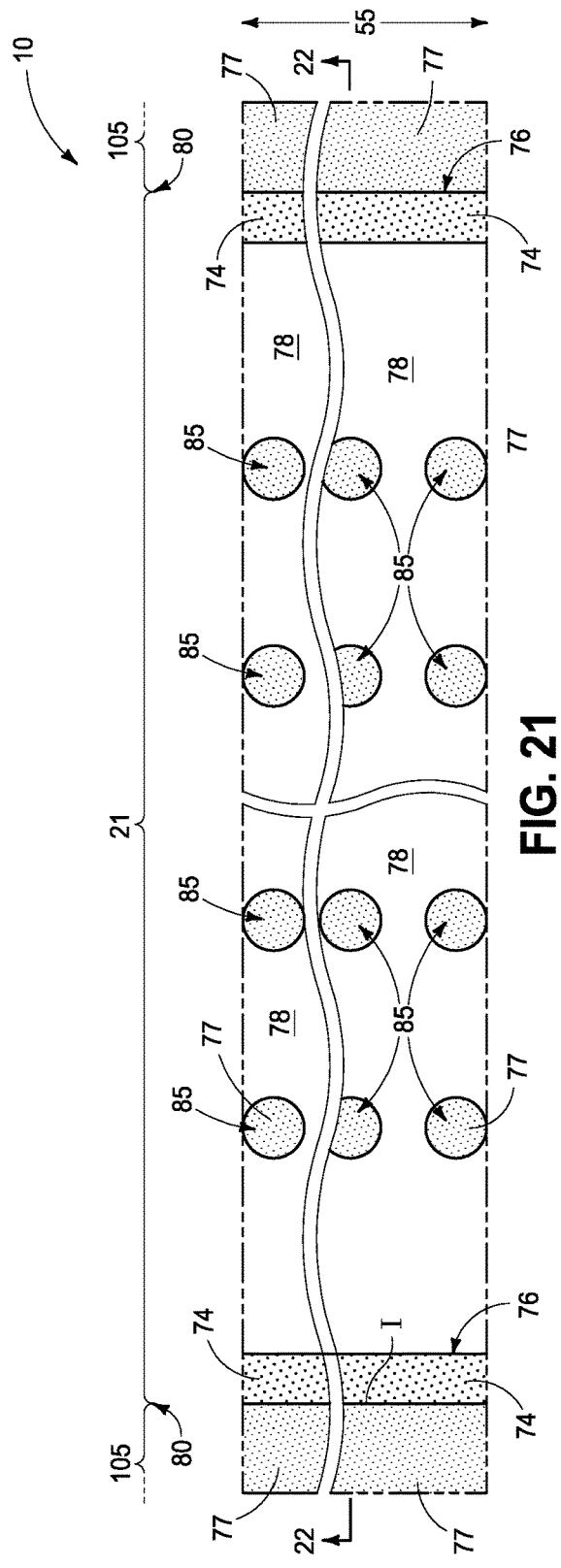
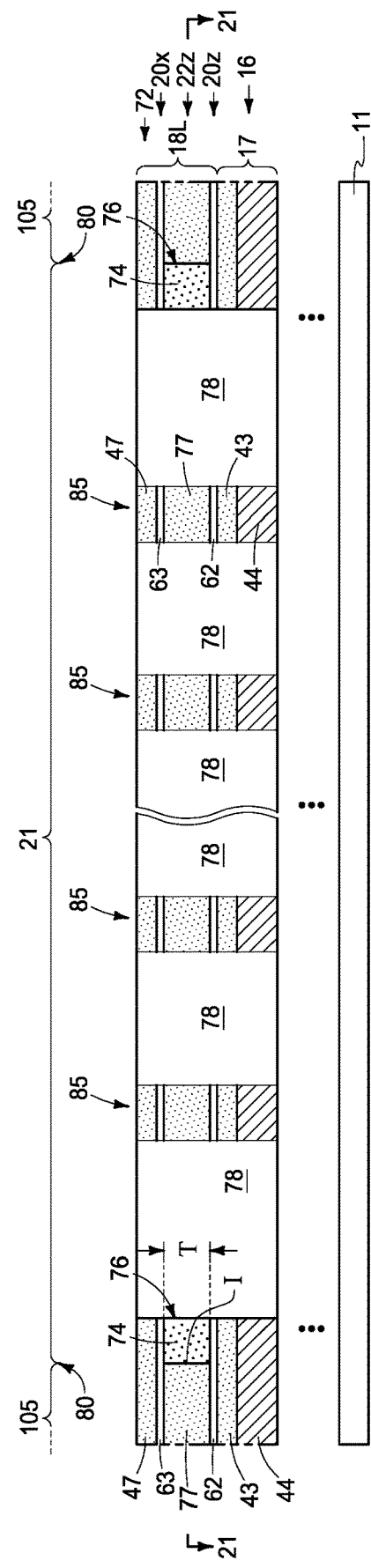
FIG. 21
FIG. 22

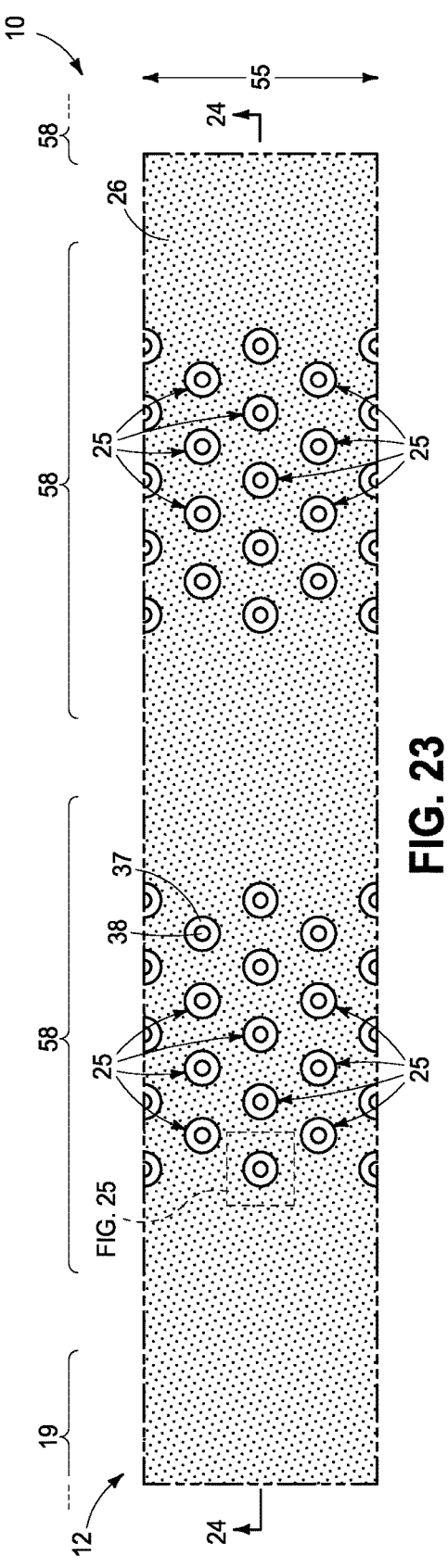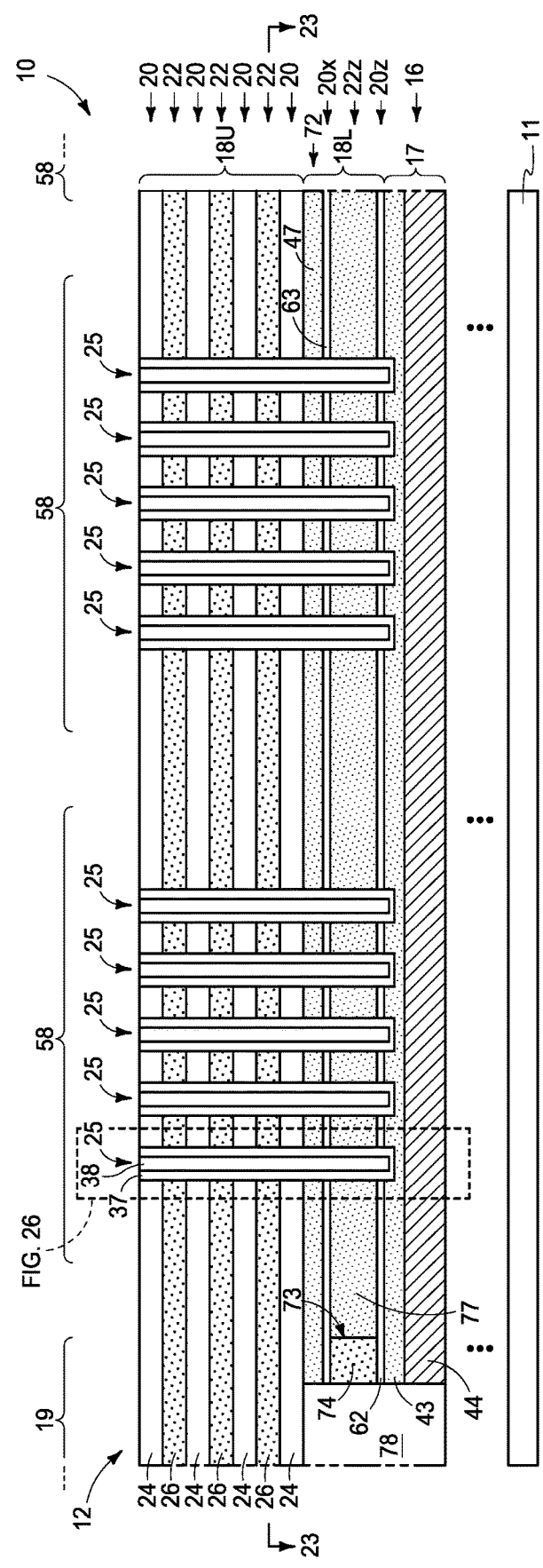
FIG. 23
FIG. 24

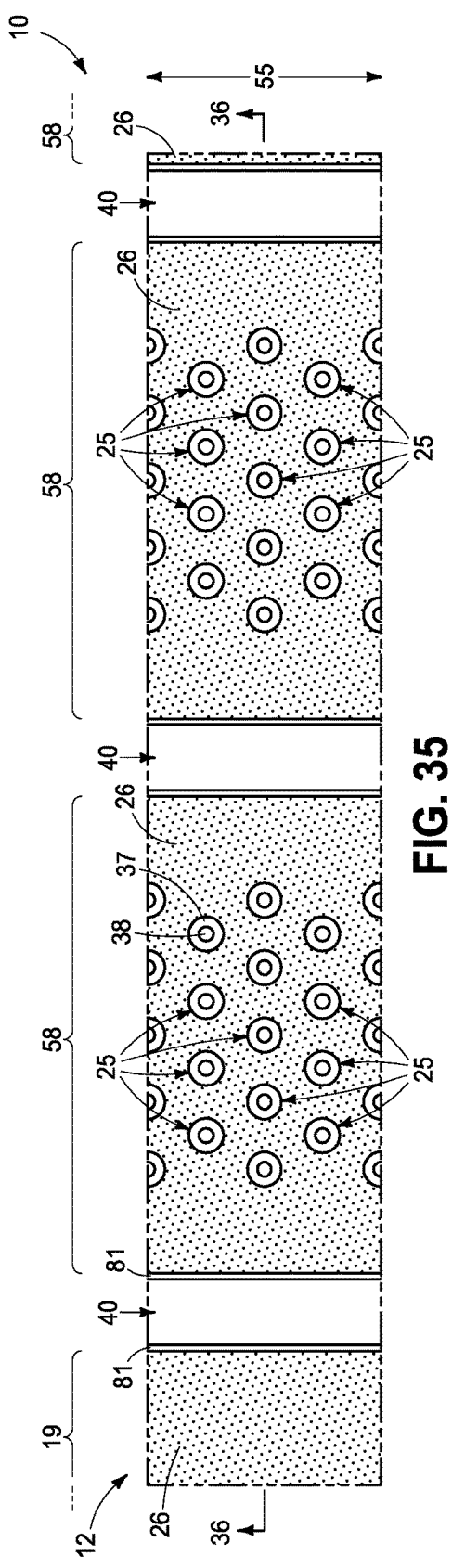
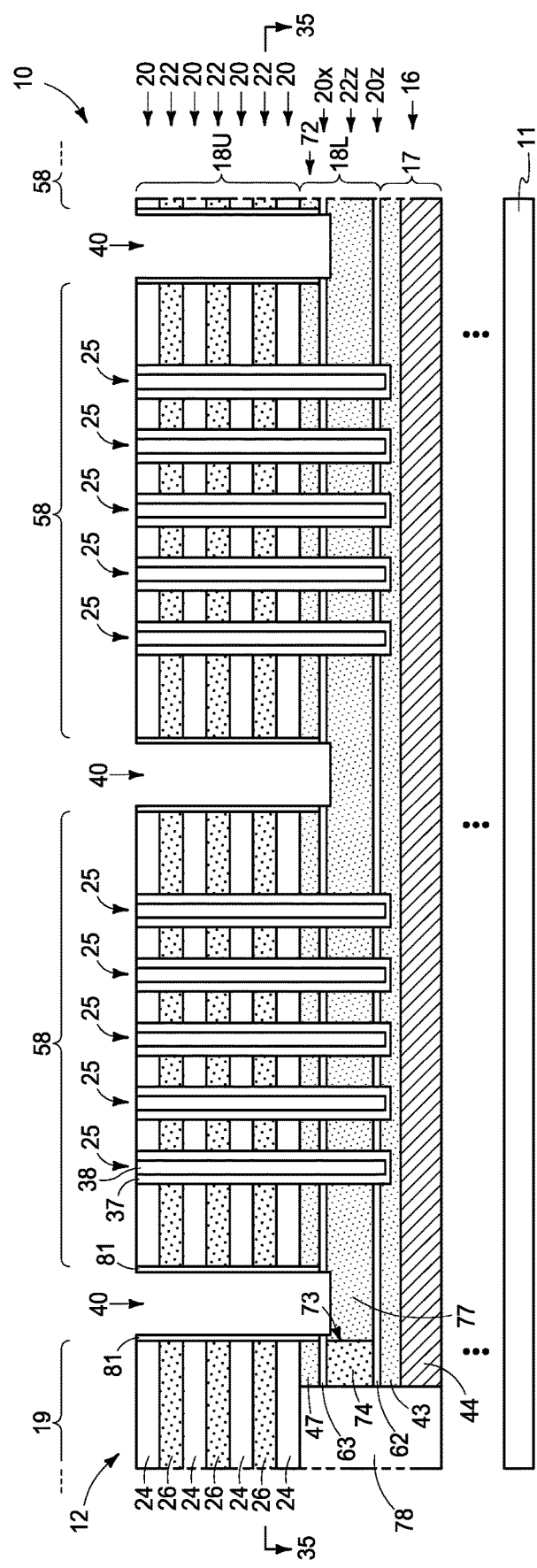

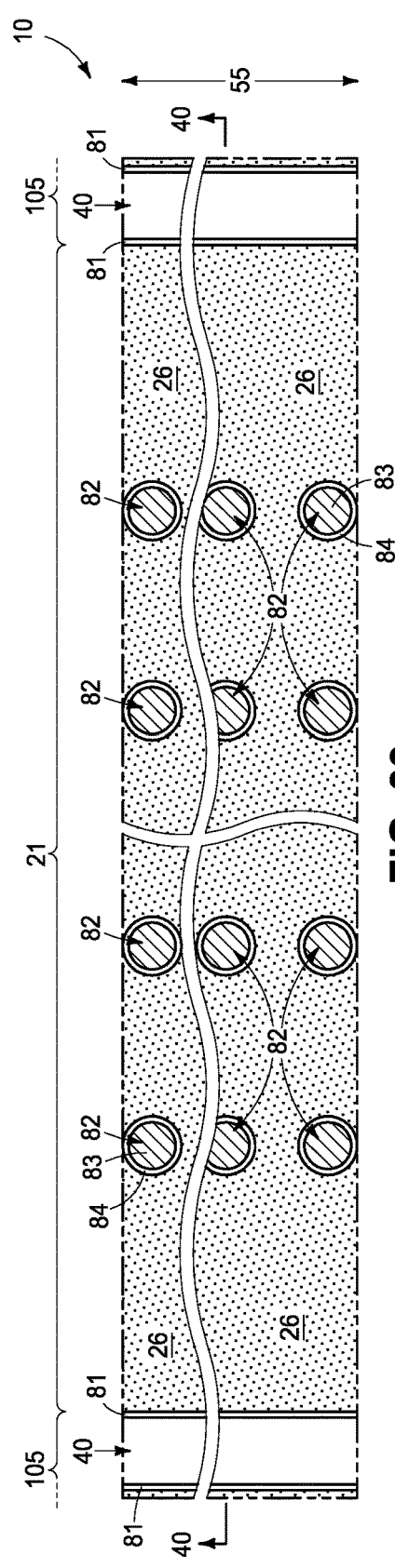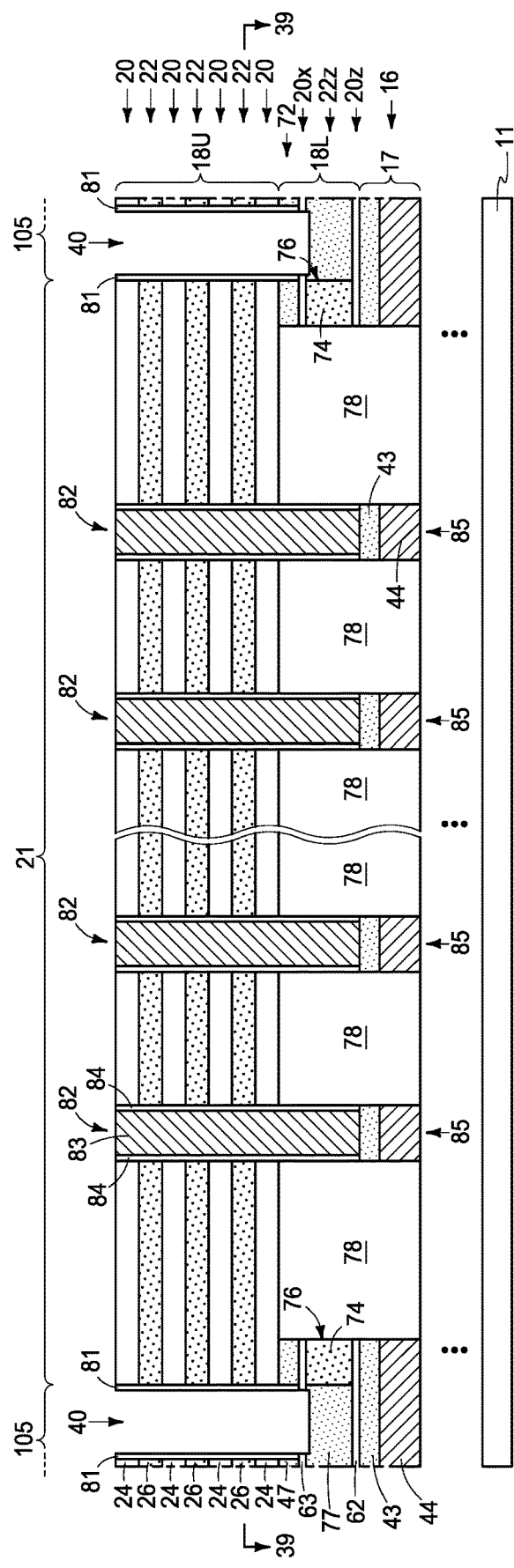
FIG. 39
FIG. 40

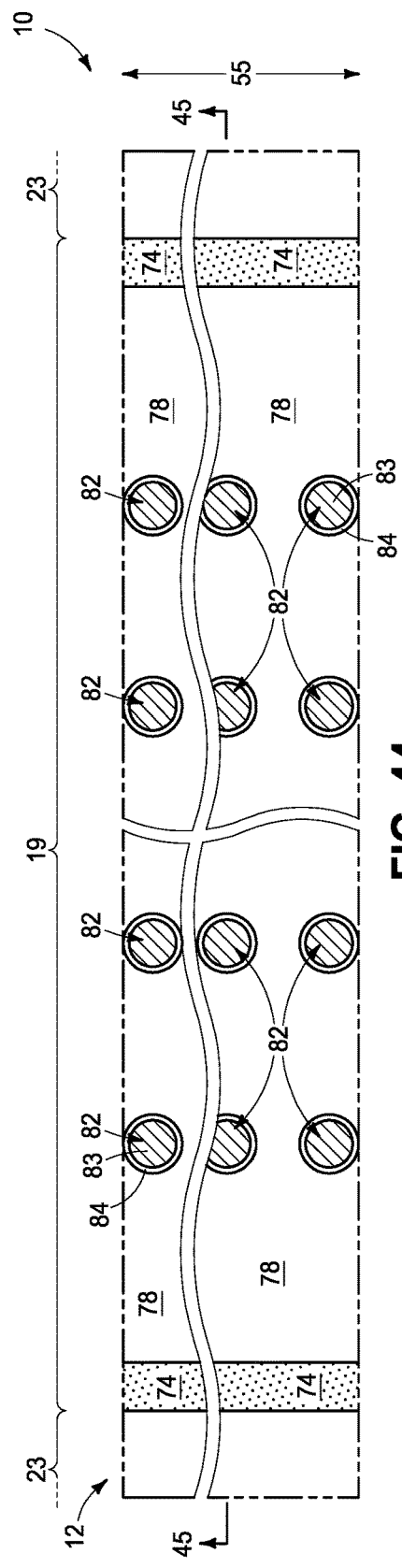
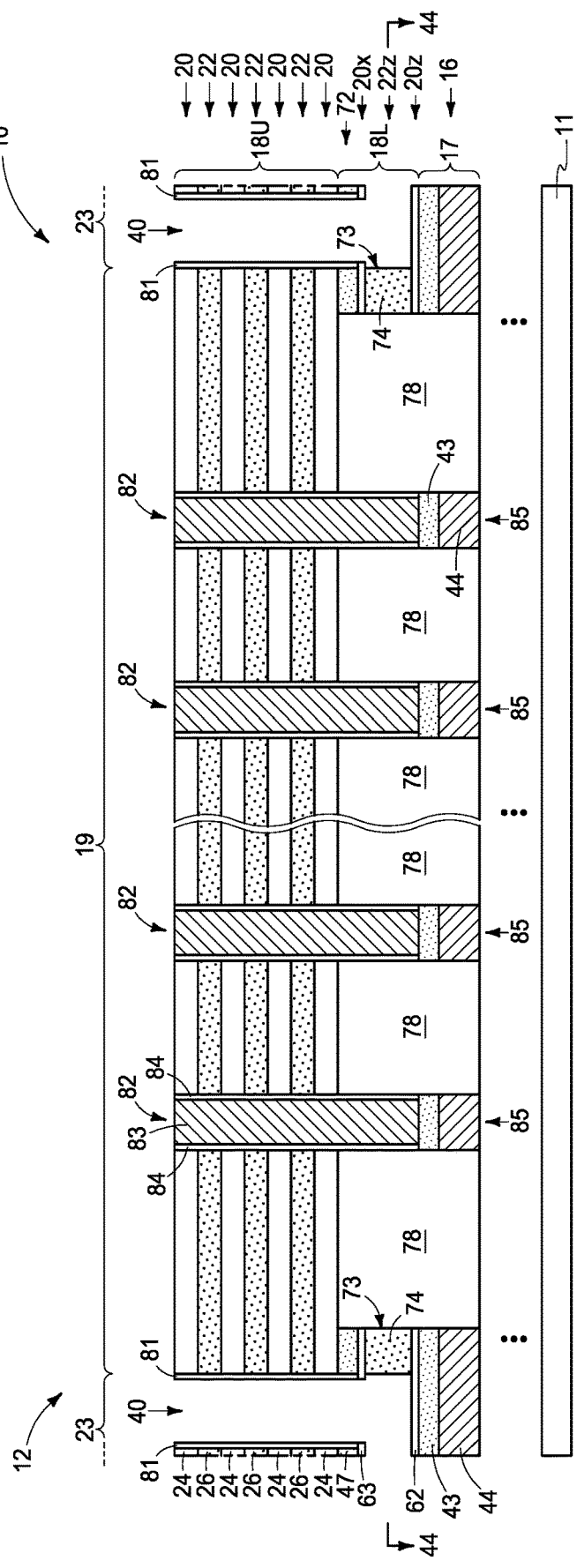
FIG. 44
FIG. 45

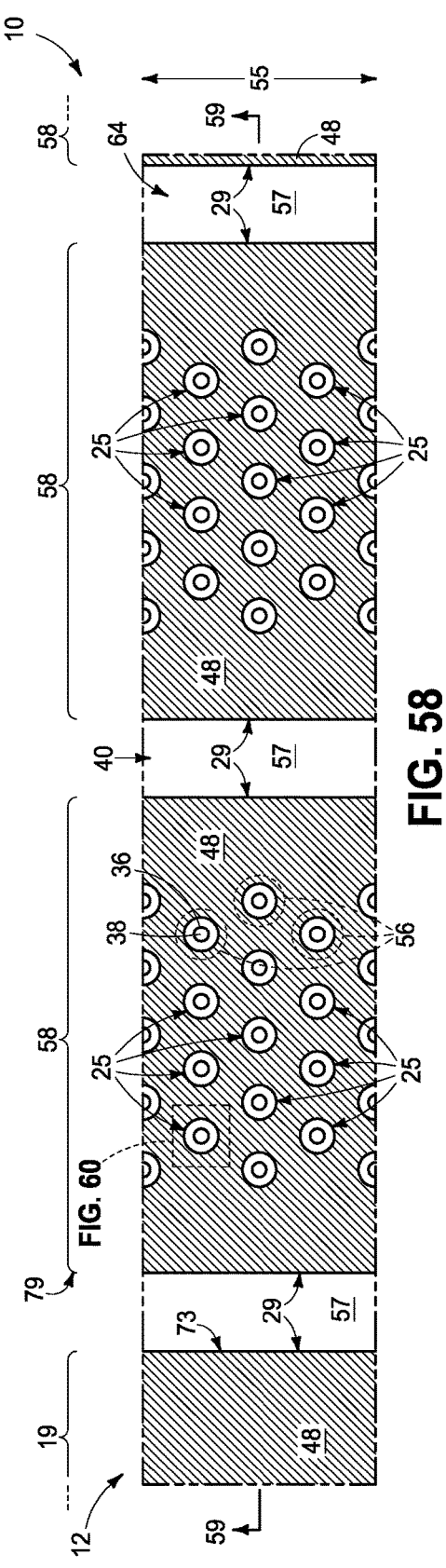
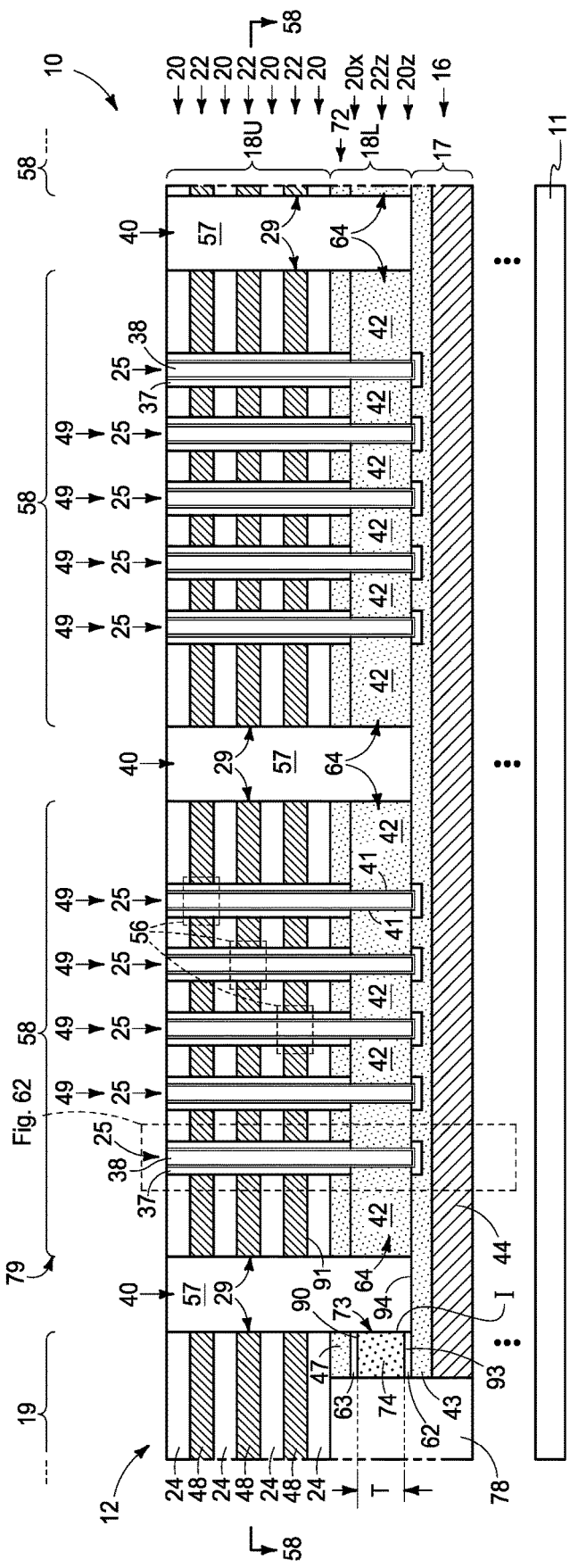
FIG. 58
FIG. 59

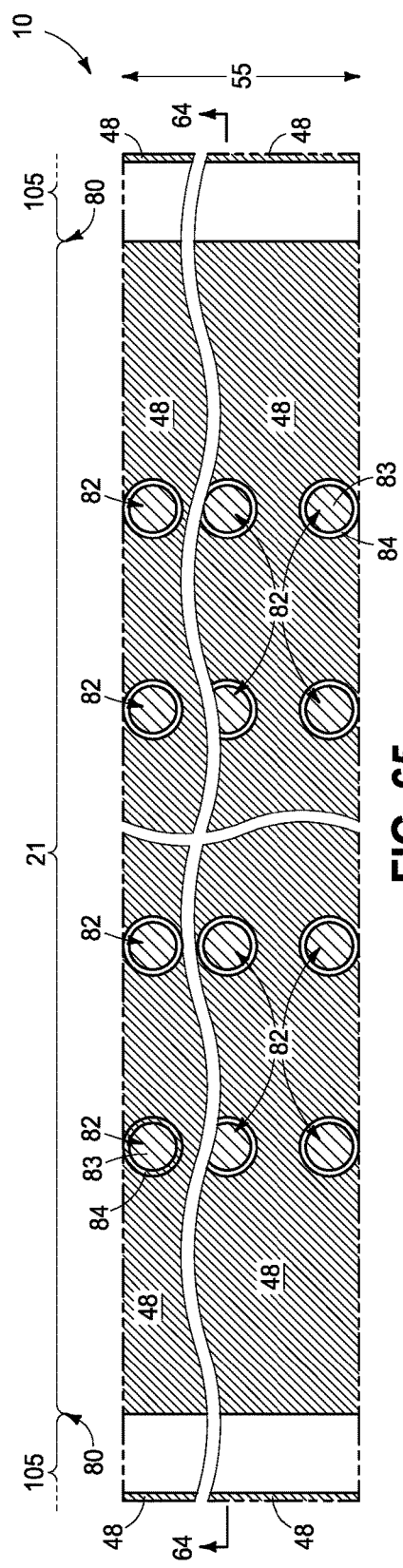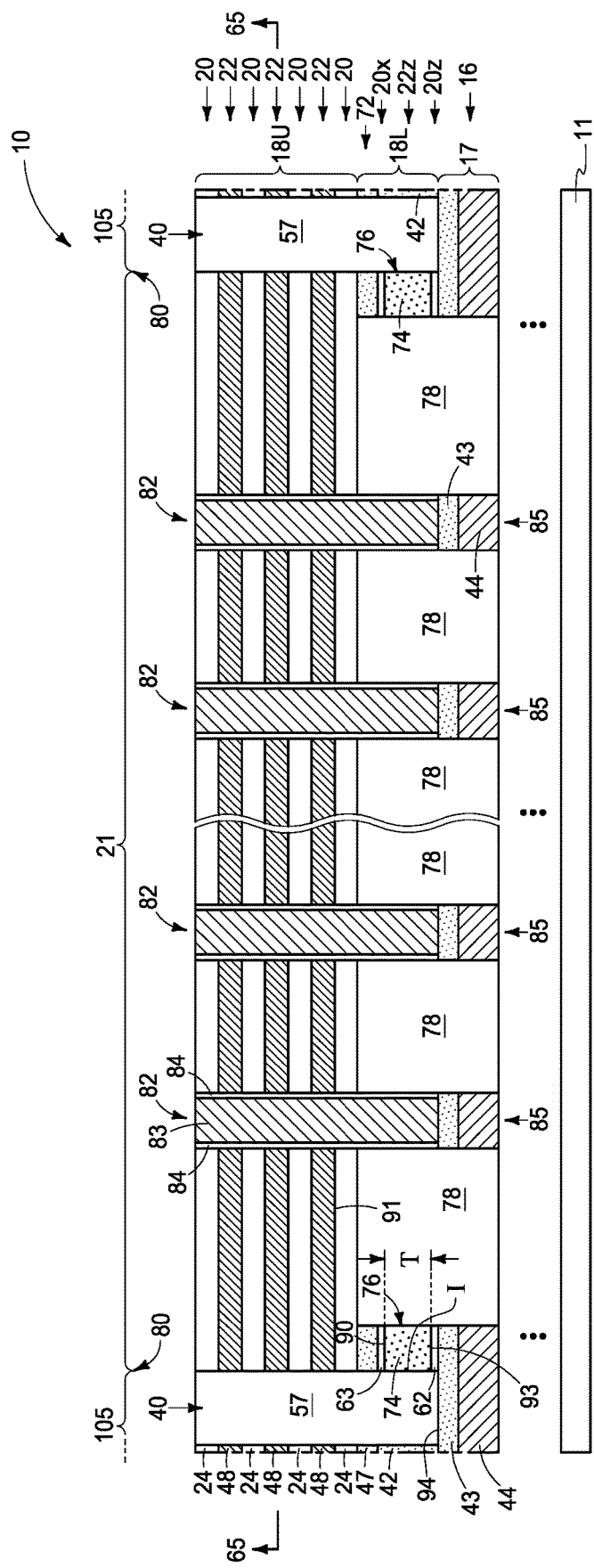

MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 2 is an enlarged diagrammatic cross-section view of a portion of FIG. 1 in process in accordance with an embodiment of the invention, and is through line 2-2 in FIG. 3.

FIG. 3 is a diagrammatic cross-section view through line 3-3 in FIG. 2.

FIGS. 4-66 are diagrammatic sequential sectional and/or enlarged views of the construction of FIGS. 1-3, or portions thereof, or alternate and/or additional embodiments, in process in accordance with some embodiments of the invention.

DETAILED DESCRIPTION OF EXAMPLE EMBODIMENTS

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are described with reference to FIGS. 1-66 which may be considered as a "gate-last" or "replacement-gate" process. Further, and regardless, the following sequence of processing steps is but one example and other sequences of the example processing steps (with or without other processing steps) may be used regardless of whether using "gate-last/replacement-gate" processing.

Figure 1:
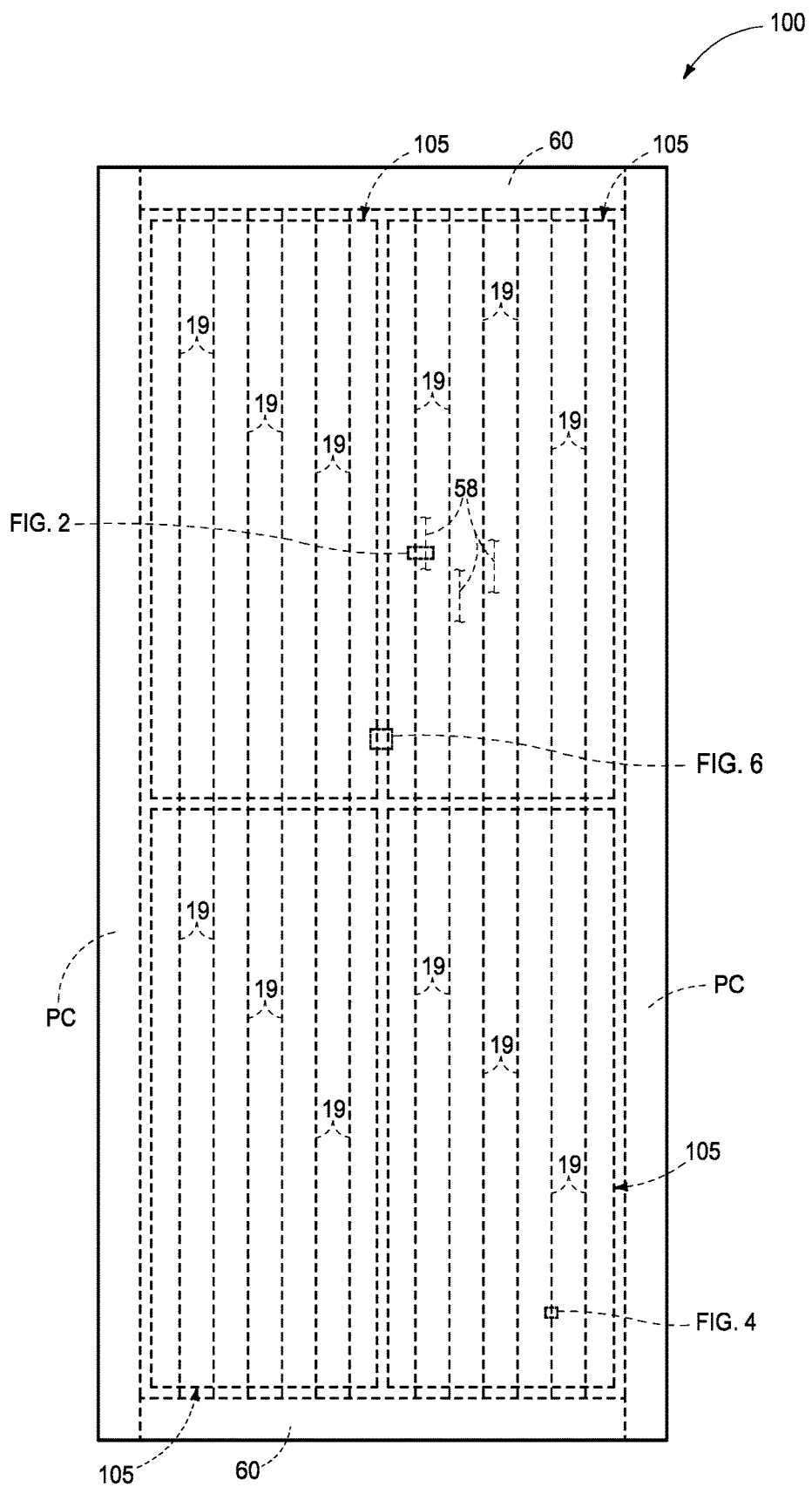
FIG. 1 is a diagrammatic top plan view of a die or die area that may be part of a larger substrate (e.g., a semiconductor wafer, and not shown).
Figure 10:
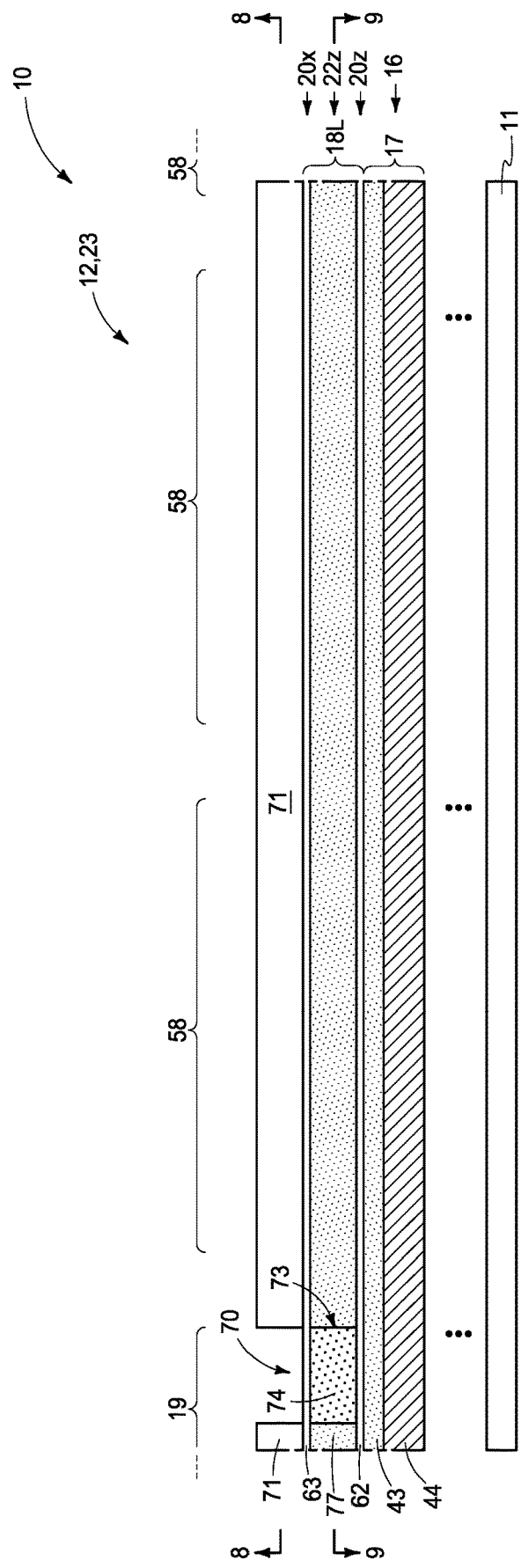
Figure 13:
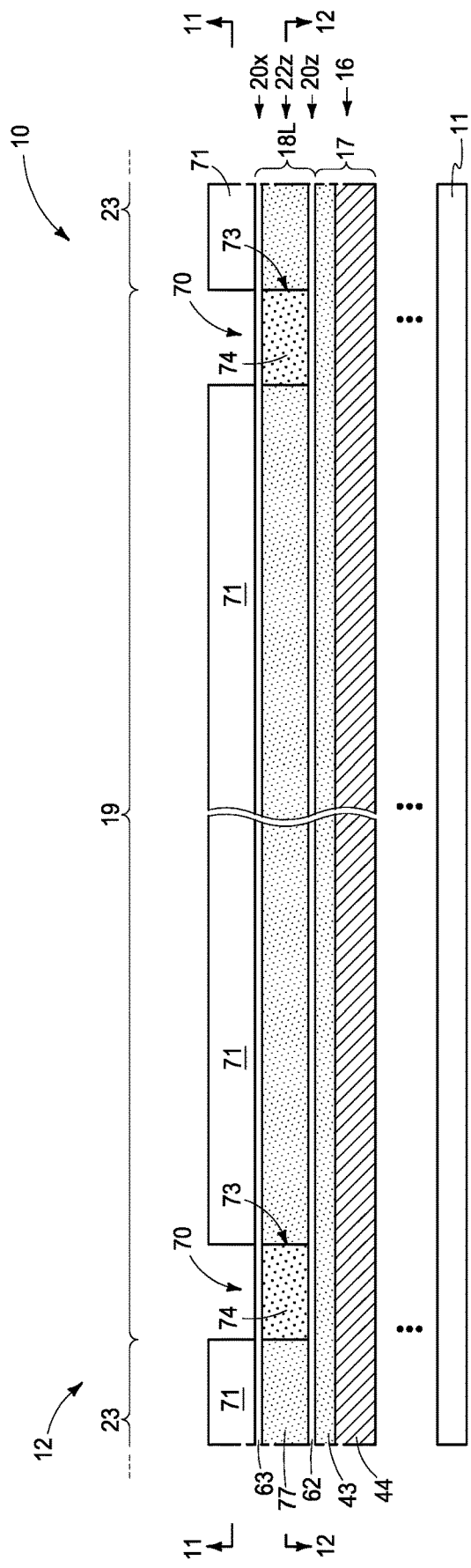
Figure 16:
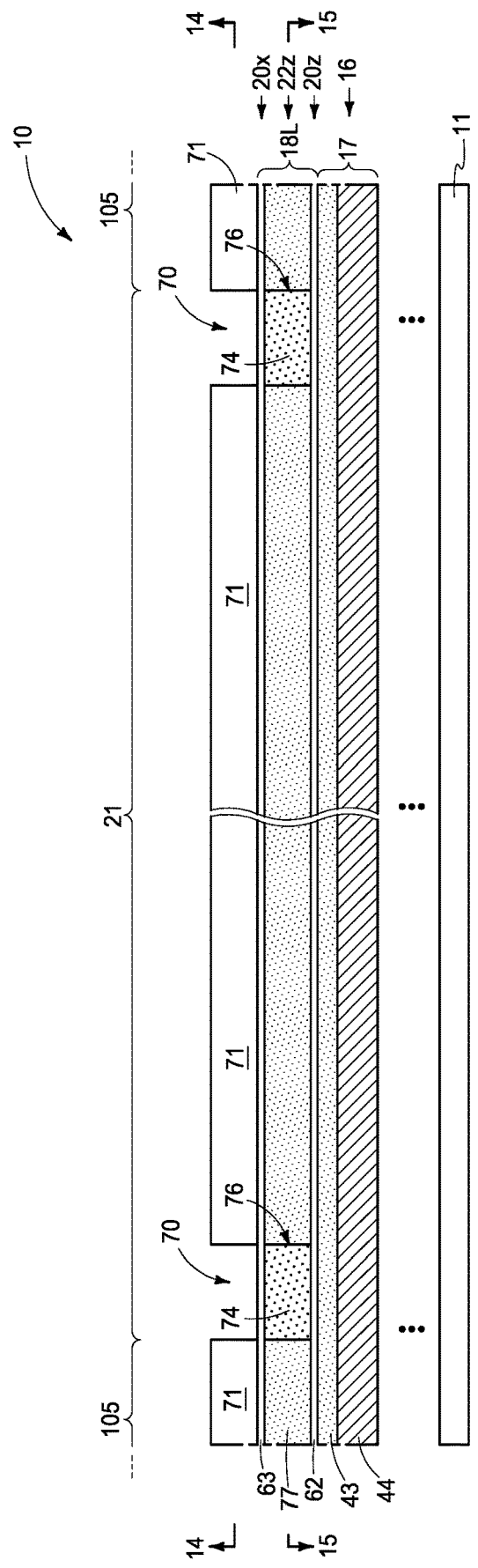
Figure 25:
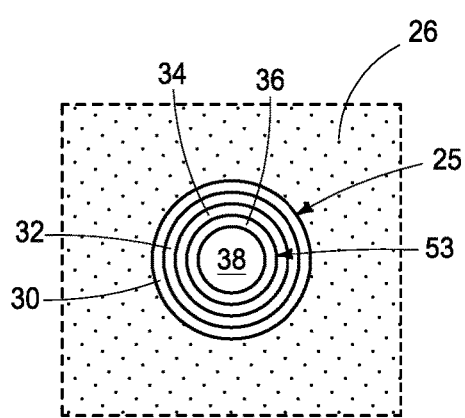
Figure 26:
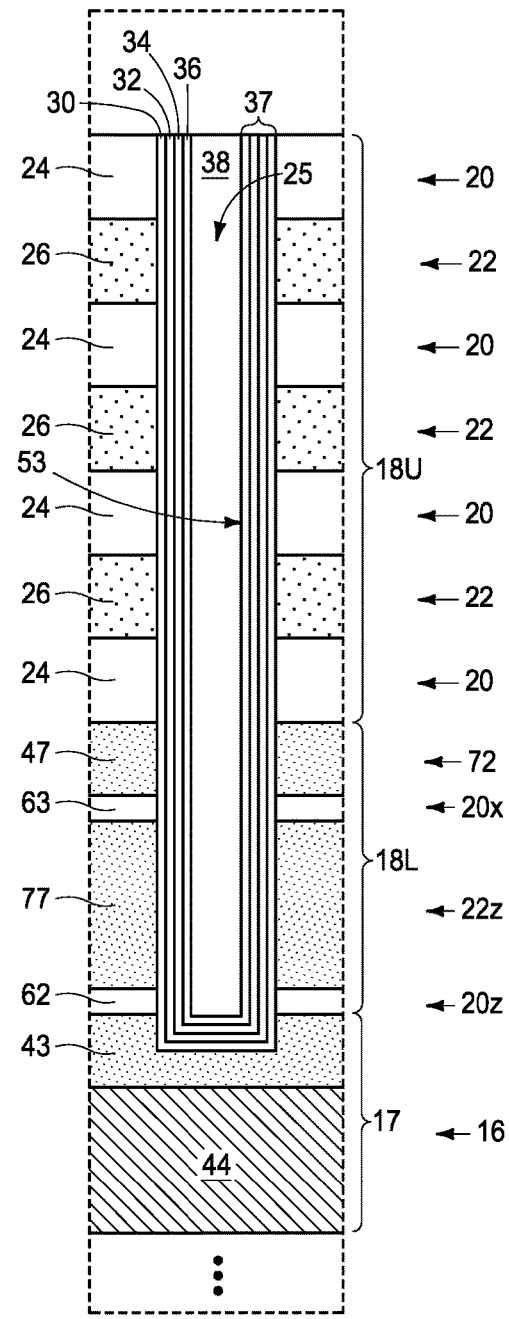
Figure 27:
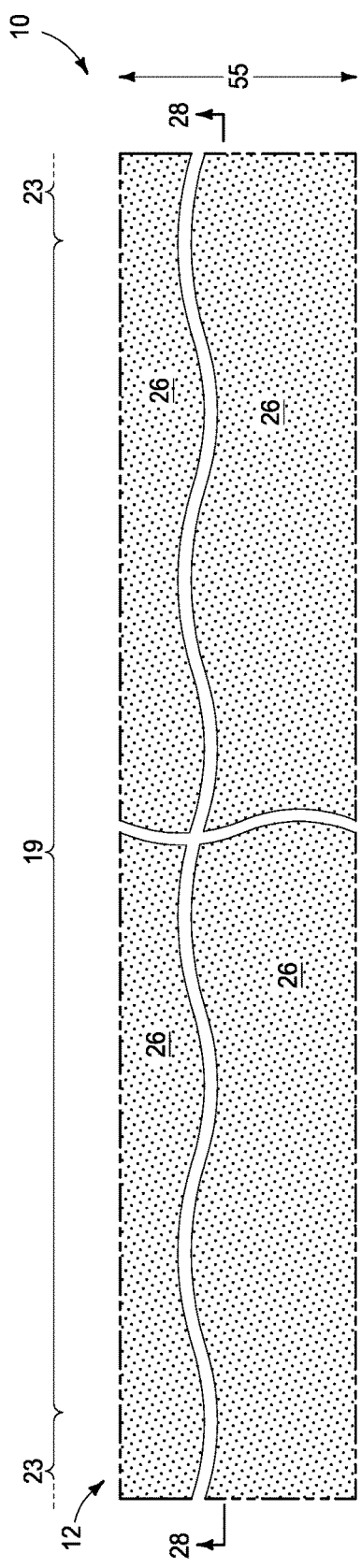

FIG. 1 shows an example diagrammatic embodiment comprising a die or die area 100 that may be part of a larger substrate (e.g., a semiconductor wafer, and not shown) and within which a memory array will be fabricated. Example die area 100 comprises at least one memory-plane region 105 (four being shown), memory-block regions 58 in individual memory-plane regions 105, a stair-step region 60 (two being shown at longitudinal ends of the memory planes), and a peripheral circuitry region PC (two being shown). In this document, "block" is generic to include "sub-block". Regions 105, 58, 60, and/or PC may not be discernable at this point of processing. Alternate orientations may be used, for example having a stair-step region between immediately-adjacent memory planes (not shown). FIGS. 2-7 are diagrammatic larger and varied scale views of portions of die area 100.

Referring to FIGS. 2-7, a construction 10 is shown in a method of forming an array or array region 12 of elevationally-extending strings of transistors and/or memory cells (not yet fabricated). Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 2-7-depicted materials. For example, other partially or wholly fabricated components of integrated circuitry may be provided somewhere above, about, or within base substrate 11. Control and/or other peripheral circuitry for operating components within an array (e.g., array 12 or memory-array region 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor material 17 as shown comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., n-type-doped or p-type-doped polysilicon). In one embodiment, lower conductor material 44 comprises metal material (e.g., a metal silicide such as WSi$_x$). Conductor tier 16 may comprise part of control circuitry (e.g., peripheral-under-array circuitry and/or a common source line or plate) used to control read and write access to the transistors and/or memory cells that will be formed within array 12.

A lower portion 18L of a stack 18* has been formed above substrate 11 and conductor tier 16 (an * being used as a suffix to be inclusive of all such same-numerically-designated components that may or may not have other suffixes). Stack 18* will comprise vertically-alternating conductive tiers 22* and insulative tiers 20*, with material of tiers 22* being of different composition from material of tiers 20* (one tier 22z and two tiers 20z and 20x being shown at this point of processing). Stack 18* comprises laterally-spaced memory-block regions 58 as part of one of memory-plane regions 105 and that will comprise laterally-spaced memory blocks 58 in a finished circuitry construction. In this document, unless otherwise indicated, "block" is generic to include "sub-block". Memory-block regions 58 and resultant memory blocks 58 (not yet shown) may be considered as being longitudinally elongated and also oriented, for example, horizontally-parallel relative one another along a direction 55. Memory-block regions 58 may not be discernable at this point of processing.

Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment, lower portion 18L comprises a lowest tier 20z of second tiers 20* directly above (e.g., directly against) conductor material 17. Example lowest second tier 20z is insulative and may be sacrificial (e.g., comprising material 62, for example silicon dioxide and/or silicon nitride). A lowest tier 22z of first tiers 22* comprising sacrificial material 77 (e.g., polysilicon or silicon nitride) is above lowest second tier 20z. A next-lowest second tier 20x of second tiers 20* is directly above lowest second tier 20z and lowest first tier 22z (e.g., comprising material 63, for example silicon dioxide and/or silicon nitride). Additional tiers may be present.

Stack 18* comprises a through-array-via (TAV) region (e.g., any one of regions 19, 21) and an operative memory-cell-string region 23. An "operative memory-cell string region" contains circuit-operative memory-cell strings in the finished construction of integrated circuitry that has been or is being fabricated. Dummy memory-cell strings (i.e., circuit-inoperative memory-cell strings comprising inoperative channel material, and not shown) may also ultimately be in operative memory-cell-string region 23 and/or in a TAV region (e.g., scattered about or grouped together laterally-adjacent circuit-operative memory-cell strings). A "TAV region" is a region in which operative TAVs are present or will be formed. An "operative TAV" is a circuit-operative conductive interconnect extending through stack 18* and between electronic components at different elevations in a finished construction of integrated circuitry that has been or is being fabricated. A TAV region may also contain one or more dummy TAVs (i.e., a circuit-inoperative structure extending through stack 18* in a finished construction of integrated circuitry that has been or is being fabricated). Regions 19/21 may essentially be undefined or indistinguishable relative one another in construction 10 at this point in processing. Example TAV region 19 (FIGS. 4 and 5) is shown as being in individual memory planes 105 (FIG. 1). Example TAV region 21 (FIGS. 6 and 7) is shown as being outside of individual memory-plane regions 105 and as being edge-of-plane (i.e., outside of a memory-plane region; e.g., closely adjacent a lateral edge of one of the memory planes). TAV regions may also be in a stair-step region (e.g., 60 and not shown).

A wall is formed in the lowest first tier aside the sacrificial material. The wall is of different composition from that of the sacrificial material and is horizontally-elongated. The wall is one of (a) or (b), where:

(a): in the memory-plane region longitudinally-along one of the memory-block regions, the one memory-block region being immediately-adjacent a through-array-via (TAV) region that is in the memory-plane region (i.e., there being no other memory-block region between said one memory-block region and the TAV region), the wall being along an edge (i.e., a lateral edge) of the one memory-block region that is closest to the TAV region (i.e., as compared to all other lateral edges of the one memory-block region) that is in the memory-plane region; and (b): in a region that is edge-of-plane relative to the memory-plane region, the edge-of-plane region comprising a TAV region, the wall being horizontally-elongated relative to an edge (i.e., a lateral edge) of the TAV region that is in the edge-of-plane region.

In one embodiment, the wall comprises the (a) and in one embodiment the wall comprises the (b). In one embodiment, another of said wall is in the other of the (a) and the (b) (i.e., one of said walls is in each of the (a) and the (b) and that may be of the same or different construction[s] relative one another).

Referring to FIGS. 8-16, and in one embodiment, masking material 71 (e.g., photoresist) has been formed directly above sacrificial material 77 (e.g., and material 63 when present) and a mask opening 70 has been formed therethrough. By way of examples only, two mask openings 70 are shown in TAV region 19 and two mask openings 70 are shown in TAV region 21. In one embodiment, a mask opening 70 has a horizontal longitudinal outline the same as, yet wider than, what-will-be the wall in the (a) region or the (b) region. Alternately, and by way of example only, mask opening 70 may outwardly expose all of a TAV region 19 and/or 21. The discussion proceeds with fabrication of a wall (at least one) in memory-plane region 105 and a wall (at least one) in the edge-of-plane region. A substance has been one of (i.e., at least one of) ion implanted, plasma doped, or diffusion doped through mask opening 70 into sacrificial material 77 there-below, thereby in one embodiment forming an initial wall 73 and/or 76 comprising material 74 aside sacrificial material 77, with initial wall 73 and/or 76 being of different composition from that of sacrificial material 77, being horizontally-elongated, and in one such latter embodiment being horizontally-elongated parallel memory-block region 58. When both of walls 73 and 76 are present, such need not be of the same construction relative one another. A mask opening 70 and a wall 73 and/or 76 may be in TAV region 19 or TAV region 21, respectively, and overlap into immediately-laterally-adjacent region 23 or 105, respectively (not shown). Multiple walls 73 and/or 76 would likely be formed, however with the discussion largely proceeding with respect to a single wall 73 and a single wall 76. Further, if multiple walls, all walls 73 may not be of the same composition and/or construction relative one another and all walls 76 may not be of the same composition and/or construction relative one another. Further, if both walls 73 and 76 are present, walls 73 and 76 may not be of the same composition and/or construction relative one another.

In one embodiment, wall 73 and/or 76 (material 74 thereof) and sacrificial material 77 comprise a same primary material (e.g., polysilicon), with the same primary material being doped with the substance whereby such same primary material of sacrificial material 77 comprises less, if any, of the substance than does the same primary material of wall 73 and/or 76. Example such substances for a primary material that is polysilicon and for other primary materials are one (at least one) of B, C, O, or N. Regardless, an example goal in providing a wall 73 and/or 76 aside sacrificial material 77, with both being of different compositions relative to one another, is to provide etch selectivity in etching sacrificial material 77 selectively relative to wall 73 and/or 76 as described below.

Referring to FIGS. 17-22, and in one embodiment, masking material 71 (not shown) has been removed and a conducting-material tier 72 has been formed directly above next-lowest second tier 20x (e.g., comprising conducting material 47; e.g., conductively-doped polysilicon). Thereafter, and regardless, initial wall 73 and/or 76 has/have been etched completely there-through to reduce its/their width(s). In one such embodiment and by way of example only, such may occur by forming a masking material and mask opening(s) therethrough (neither being shown) above construction 10, with such masking material covering all of array region 12, covering reduced-width walls 73 and/or 76 in TAV regions 19 and 21, and covering islands/island locations 85 in TAV regions 19 and 21 where TAVs will ultimately be located. Thereafter, materials 47, 63, 77, 62 and 17 that are ultimately exposed (through a mask opening remaining thereby) have been etched through, the masking material removed, and void space left thereby filled with insulator material 78 (e.g., silicon dioxide and/or silicon nitride, by overfilling such void space and planarizing such back at least to a top surface of remaining material 47).

Each of walls 73 is an example wall that is in the (a), and in one such embodiment where wall 73 is along all of the edge of the one memory-block region 58 that is closest to TAV region 19 that is in memory-plane region 105 (e.g., all along edge 79 and regardless of whether considering a wall 73 as shown in FIGS. 17, 18 or a wall 73 as shown in FIGS. 19, 20 and regardless of whether a wall 73 is directly against edge 79). Wall 73 in FIGS. 17, 18 may be of the same construction, composition, and position (or mirrored position) as wall 73 in FIGS. 19, 20, with no edge 79 and no memory-block region 58 being shown/designated in FIGS. 19, 20 for brevity and due to scale. Each of walls 76 is an example wall that is in the (b), and in one such embodiment where wall 76 is along all of the edge of TAV region 21 (e.g., all along edge 80) that is in the edge-of-plane region (e.g., between immediately-laterally adjacent memory planes 105 and regardless of whether a wall 76 is directly against edge 80).

In one embodiment, wall 73 and/or 76 is insulative. In one embodiment, wall 73 and/or 76 is directly against sacrificial material 77, and in one such embodiment wall 73 and/or 76 have the same thickness (e.g., T) at an interface thereof (e.g., I).

The above are but example embodiments of forming wall 73 and/or wall 76. Again, either could be formed without forming the other or both could be formed (regardless, meaning one or more of wall 73 and/or wall 76). Regardless, another example method of forming wall 73 and/or 76 includes forming a mask opening in masking material that is directly above the sacrificial material. Then, etching may be conducted through the mask opening to form a horizontally-elongated wall-trench through the sacrificial material (e.g., the wall-trench having the same size and shape as the finished-construction wall 73 and/or 76. Thereafter, the wall-trench may be overfilled with material of the wall, followed by removing of such material back to at least a top surface of the sacrificial material. Any other attribute(s) or aspect(s) as shown and/or described herein with respect to other embodiments may be used.

Referring to FIGS. 23-30, an upper portion 18U of stack 18* has been formed above lower portion 18L. Upper portion 18U comprises vertically-alternating different composition first tiers 22 and second tiers 20. First tiers 22 may be conductive and second tiers 20 may be insulative, yet need not be so at this point of processing in conjunction with the hereby initially-described example method embodiment which is "gate-last" or "replacement-gate". Example first tiers 22 and second tiers 20 comprise different composition materials 26 and 24 (e.g., silicon nitride and silicon dioxide), respectively. Example upper portion 18U is shown starting above lower portion 18L with a second tier 20 although such could alternately start with a first tier 22 (not shown) or conducting-material tier 72 may be considered as being in upper portion 18U (not so designated). Further, and by way of example, lower portion 18L may be formed to have one or more first and/or second tiers as a top thereof. Regardless, only a small number of tiers 20 and 22 is shown, with more likely upper portion 18U (and thereby stack 18*) comprising dozens, a hundred or more, etc. of tiers 20 and 22. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22 and/or above an uppermost of conductive tiers 22. For example, one or more select gate tiers (not shown) may be between conductor tier 16 and lowest conductive tier 22 and one or more select gate tiers may be above an uppermost of conductive tiers 22. Alternately or additionally, at least one of the depicted uppermost and lowest conductive tiers 22 may be a select gate tier.

Channel openings 25 have been formed (e.g., by etching) through second tiers 20 and first tiers 22 in upper portion 18U to conductor tier 16 in lower portion 18L (e.g., at least to lowest first tier 22z) in lower portion 18L. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest second tier 20z. A reason for extending channel openings 25 at least to conductor material 17 of conductor tier 16 is to provide an anchoring effect to material that is within channel openings 25. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

In one embodiment and as shown, charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and within individual openings 25 followed by planarizing such back at least to a top surface of stack 18*.

Channel material 36 as a channel-material string 53 has also been formed in channel openings 25 elevationally along insulative tiers 20 and conductive tiers 22. Materials 30, 32, 34, and 36 are collectively shown as and only designated as material 37 in some figures due to scale. Example channel materials 36 include appropriately-doped crystalline semiconductor material, such as one or more of silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Regardless, sacrificial etch-stop plugs (not shown) may be formed in lower portion 18L in horizontal locations where channel openings 25 will be prior to forming upper portion 18U. Channel openings 25 may then be formed by etching materials 24 and 26 to stop on or within the material of the sacrificial plugs, followed by exhuming remaining material of such plugs prior to forming material in channel openings 25. A radially-central solid dielectric material 38 (e.g., spin-on-dielectric, silicon dioxide, and/or silicon nitride) is shown in channel openings 25. Alternately, and by way of example only, the radially-central portion within channel openings 25 may include void space(s) (not shown) and/or be devoid of solid material (not shown).

Figure 28:
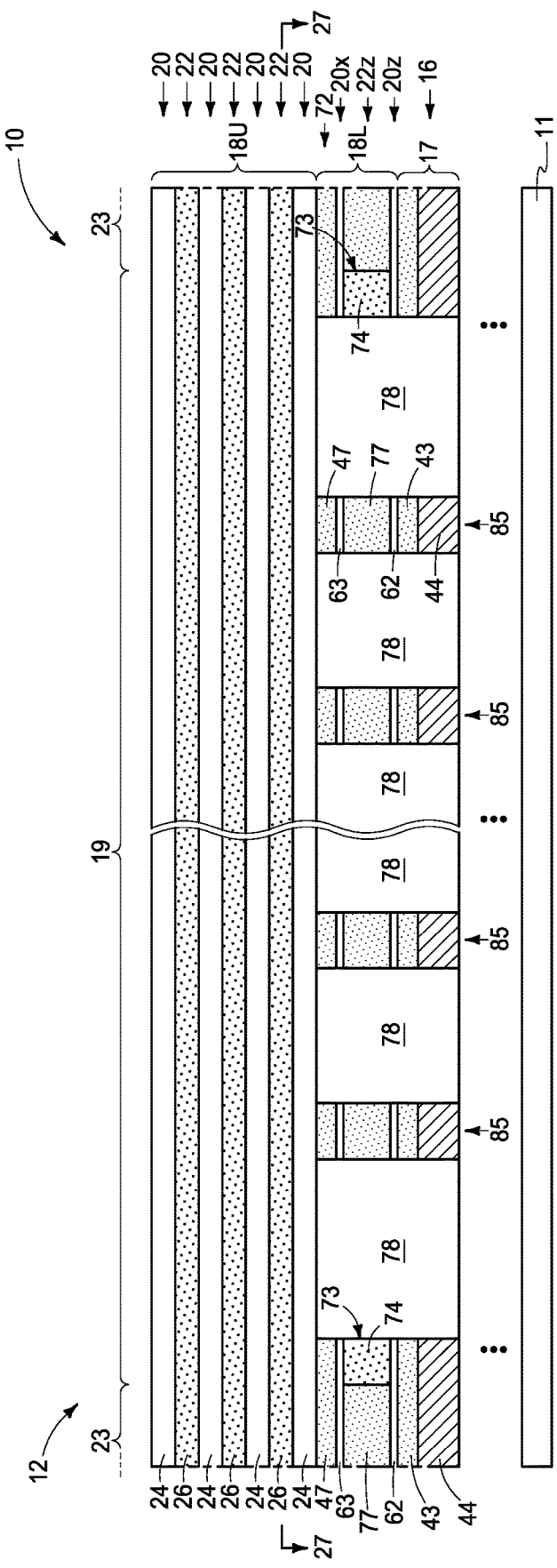
Figure 29:
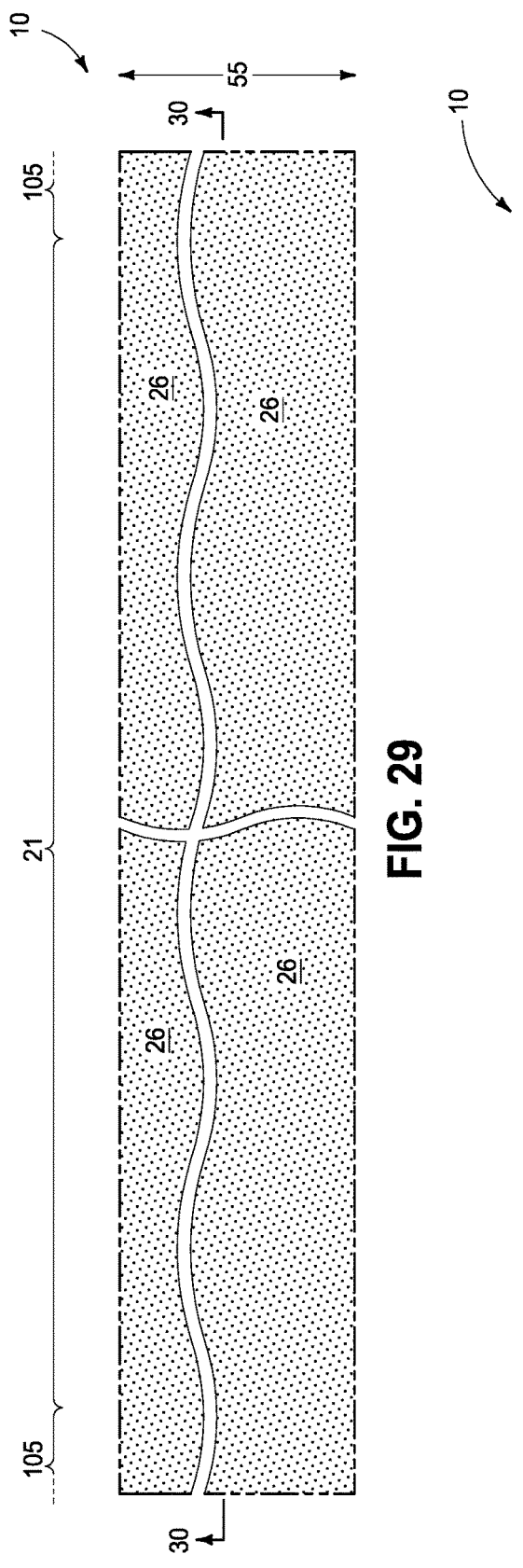
Figure 30:
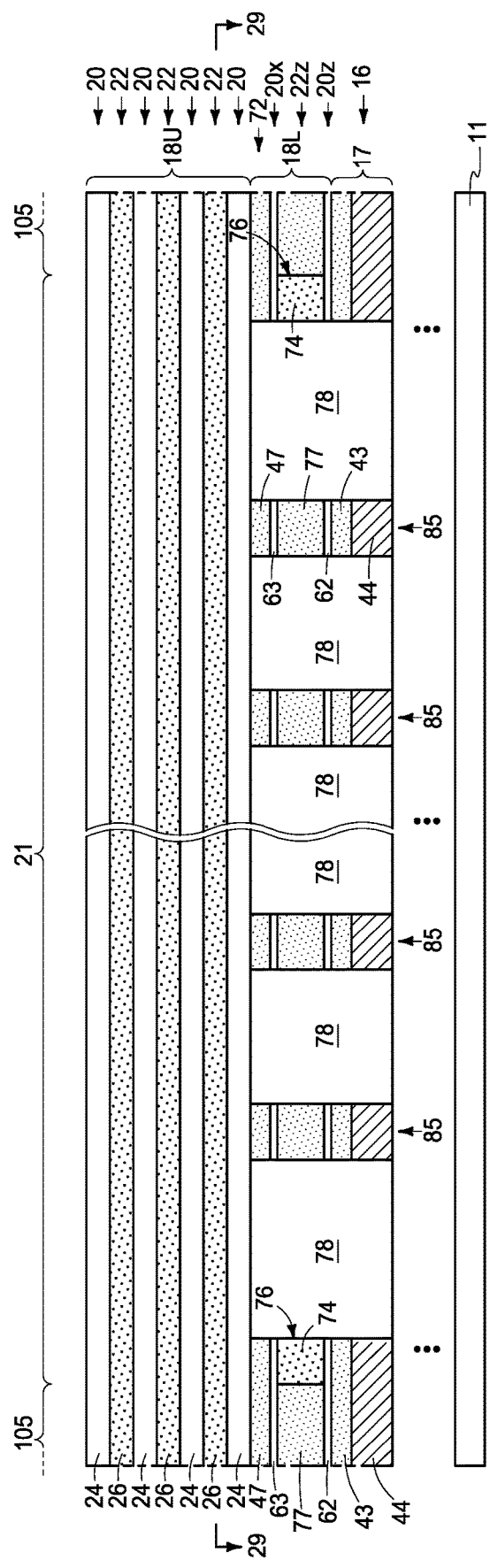
Figure 31:
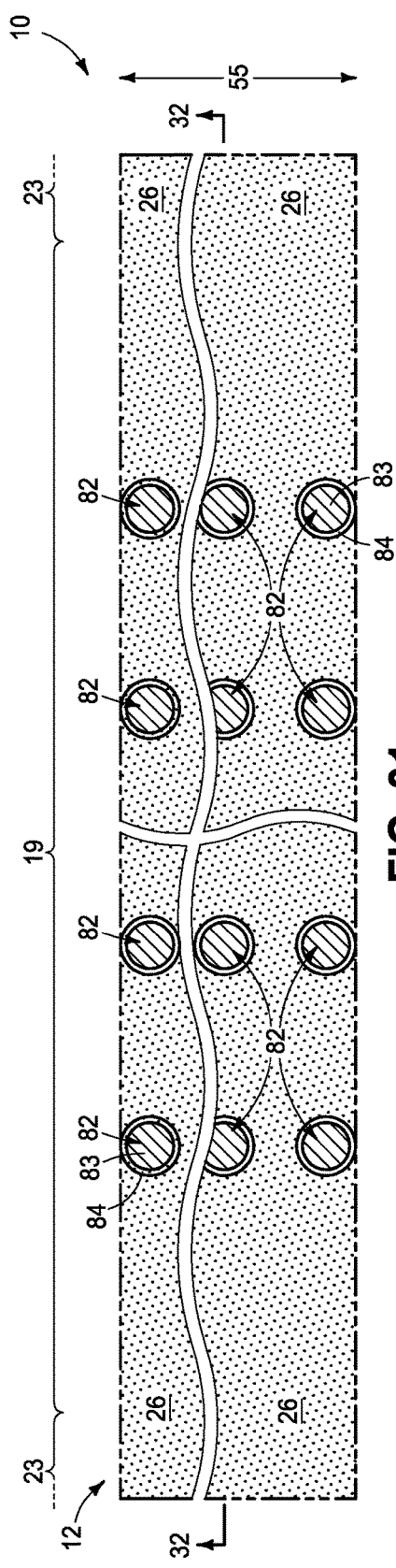
Figure 32:
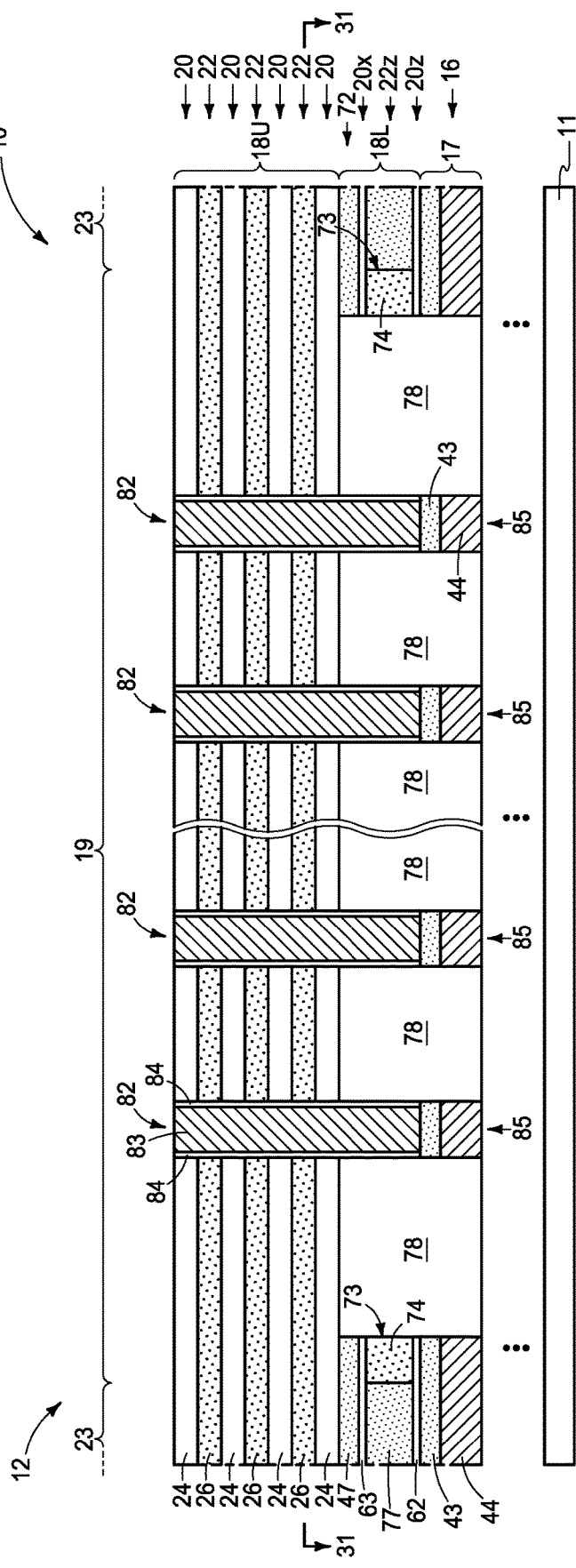
Figure 33:
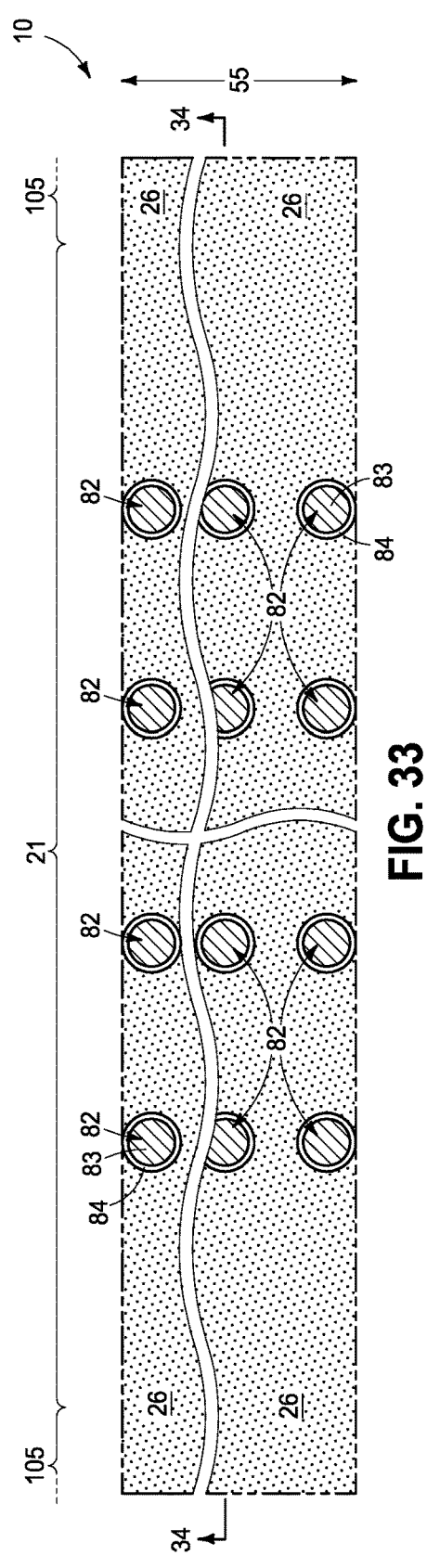
Figure 34:
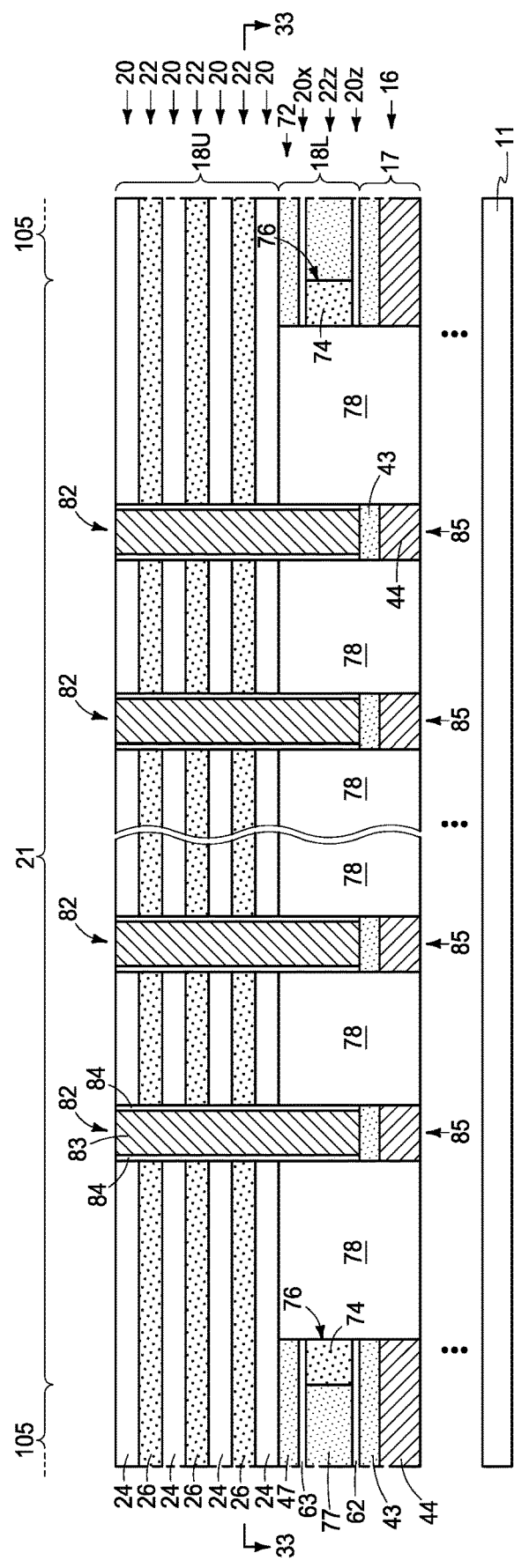
Figure 37:
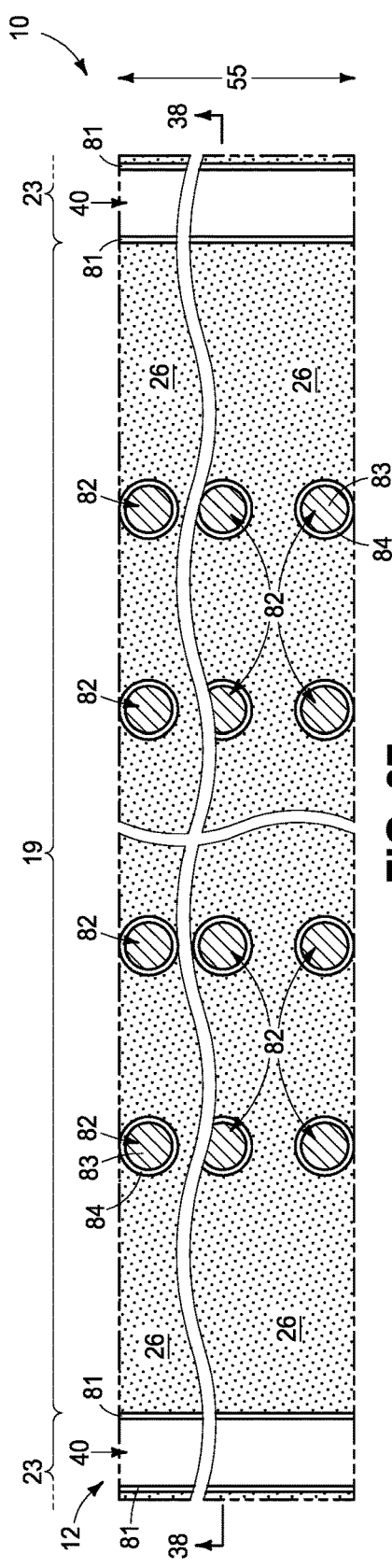
Figure 38:
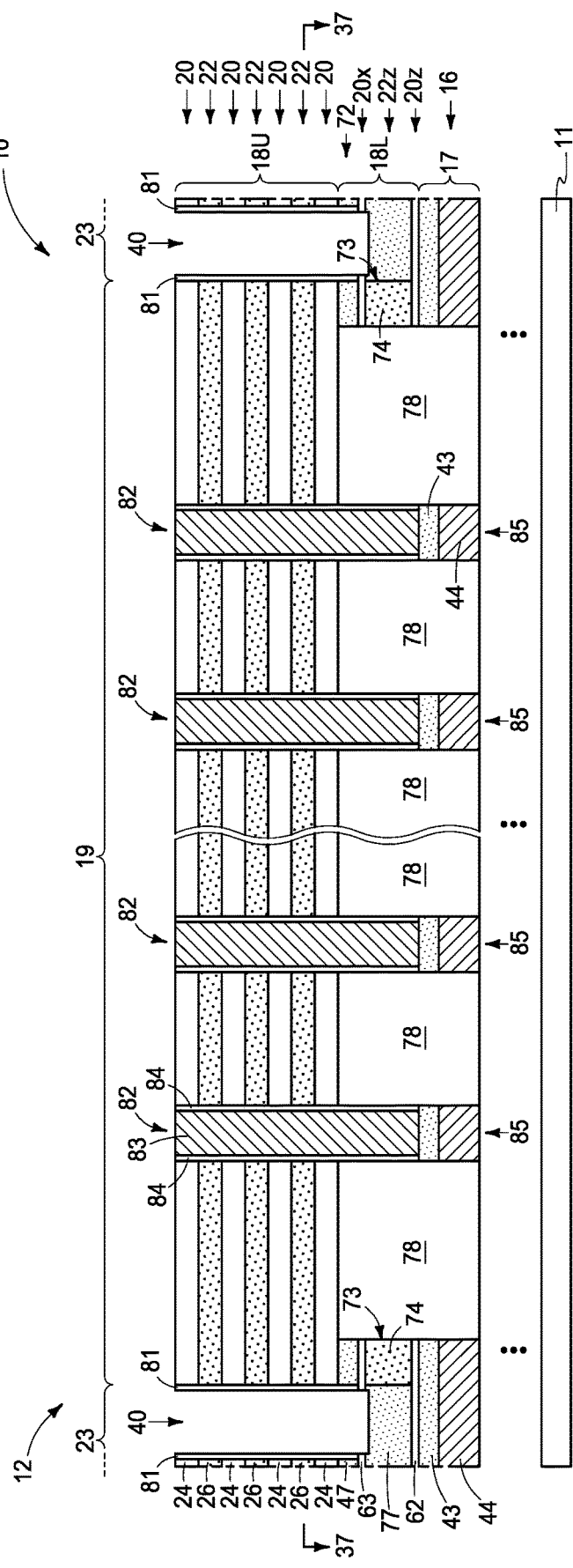
Figure 41:
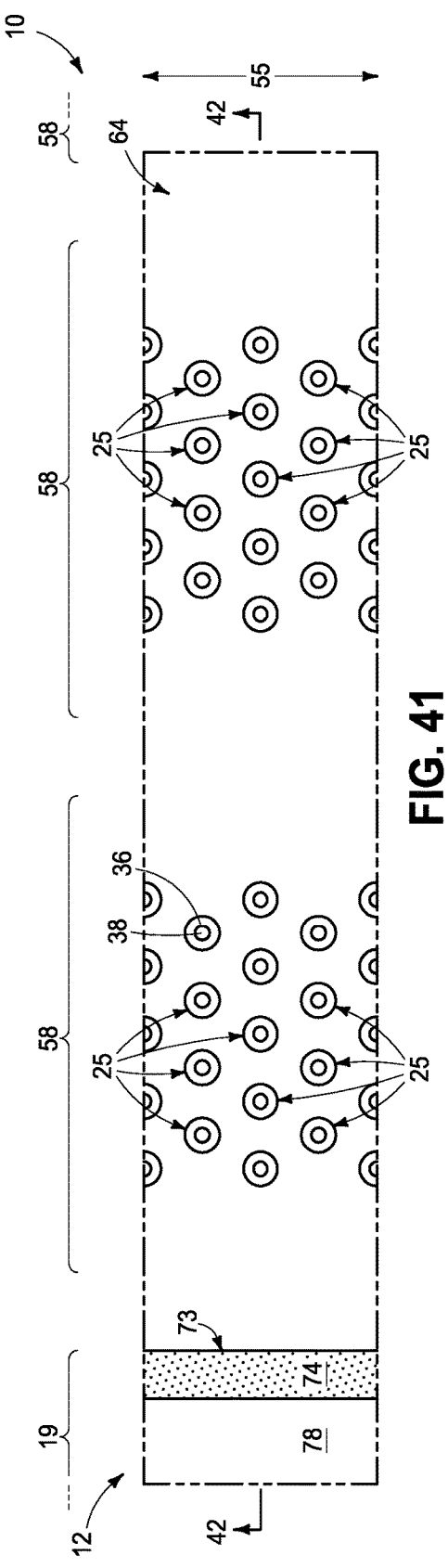
Figure 42:
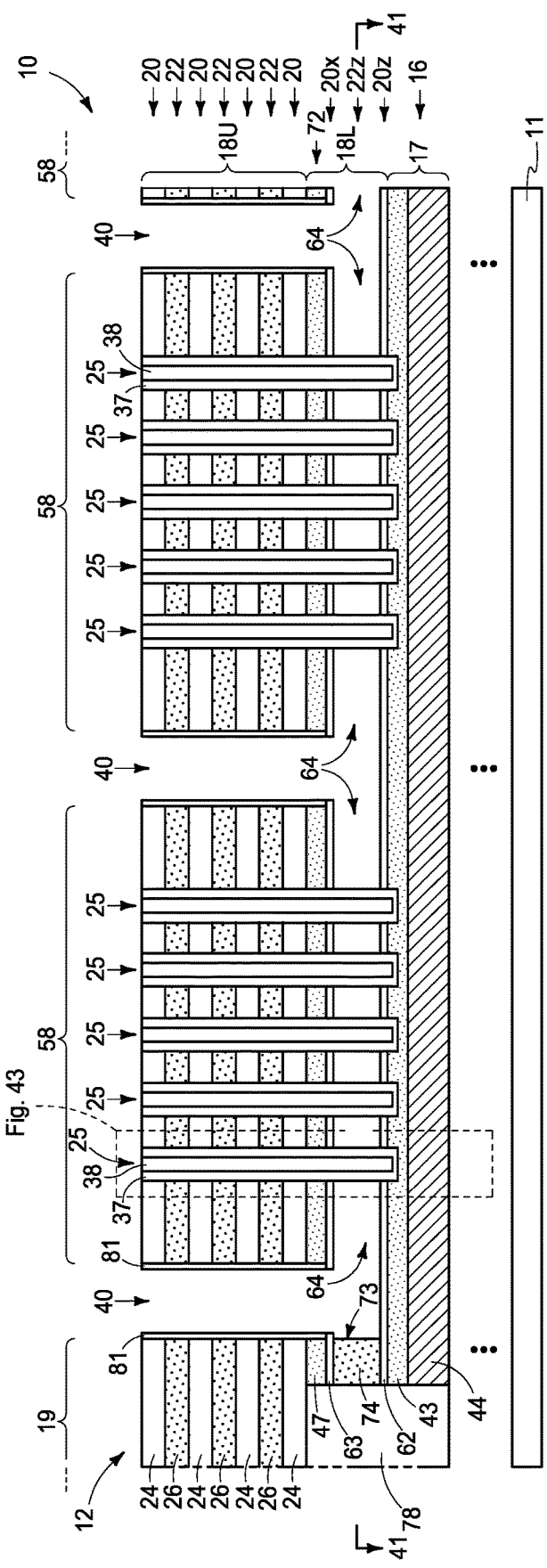
Figure 43:
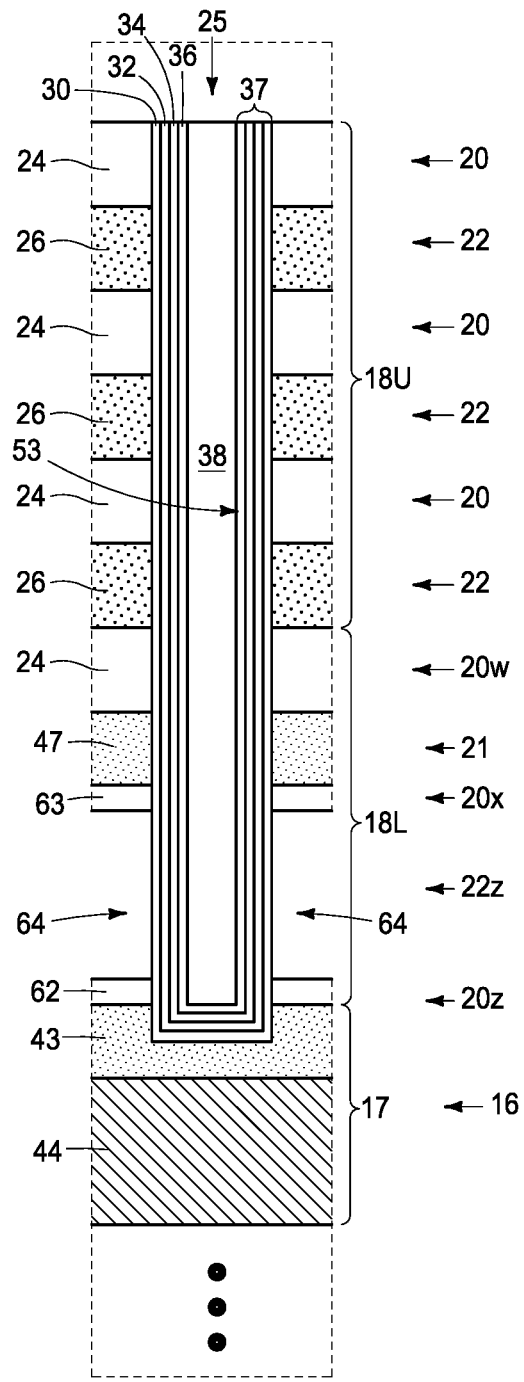
Figure 46:
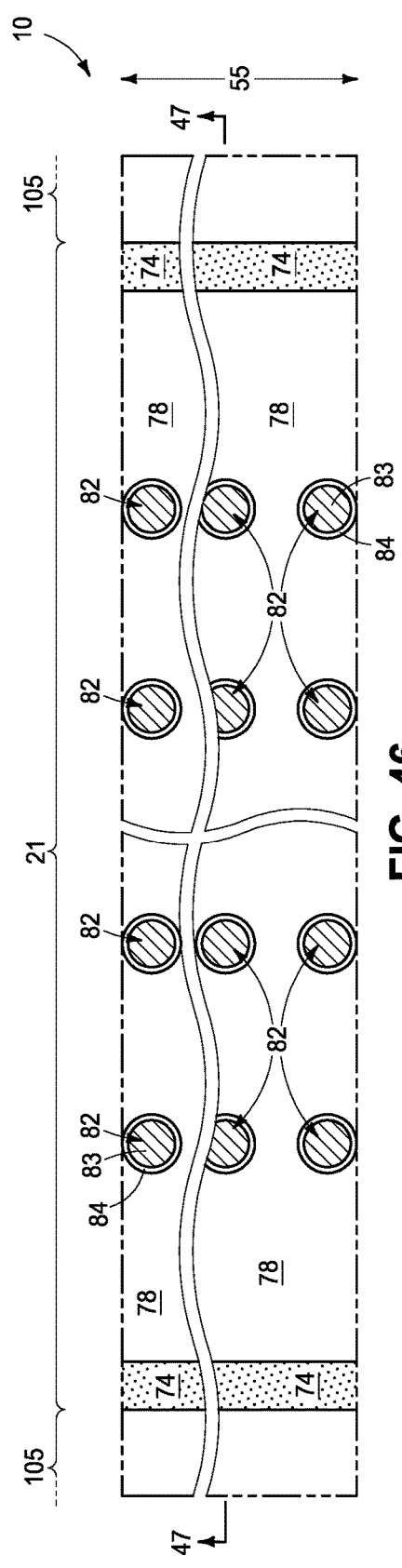
Figure 47:
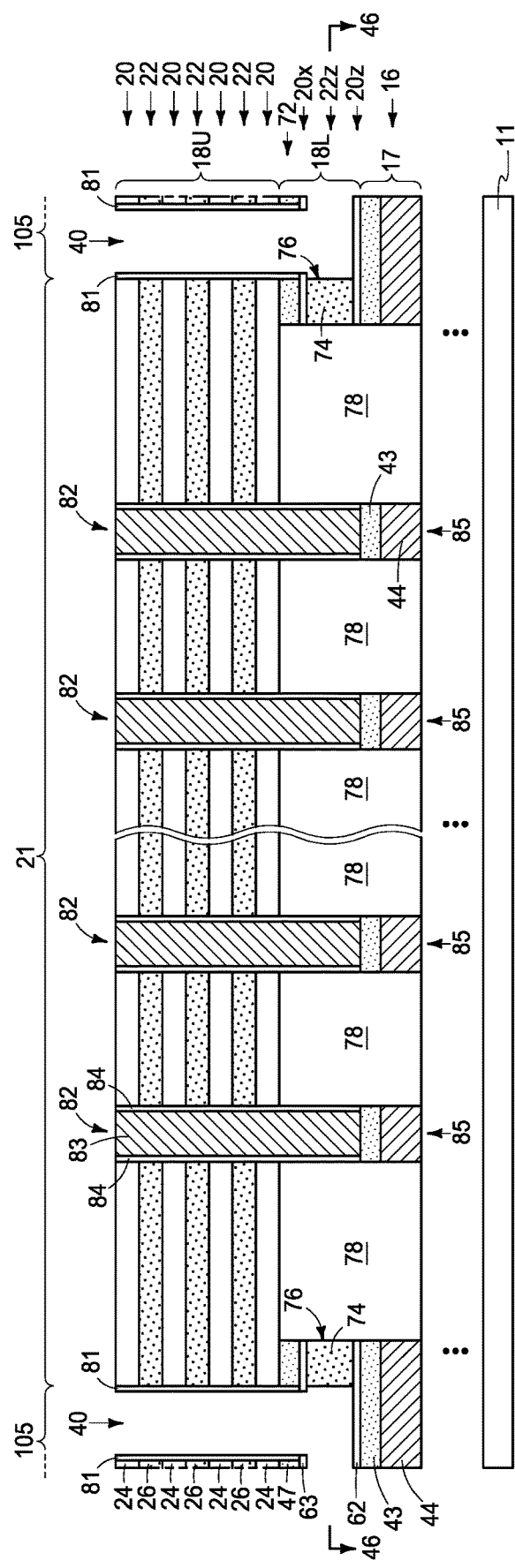
Figure 48:
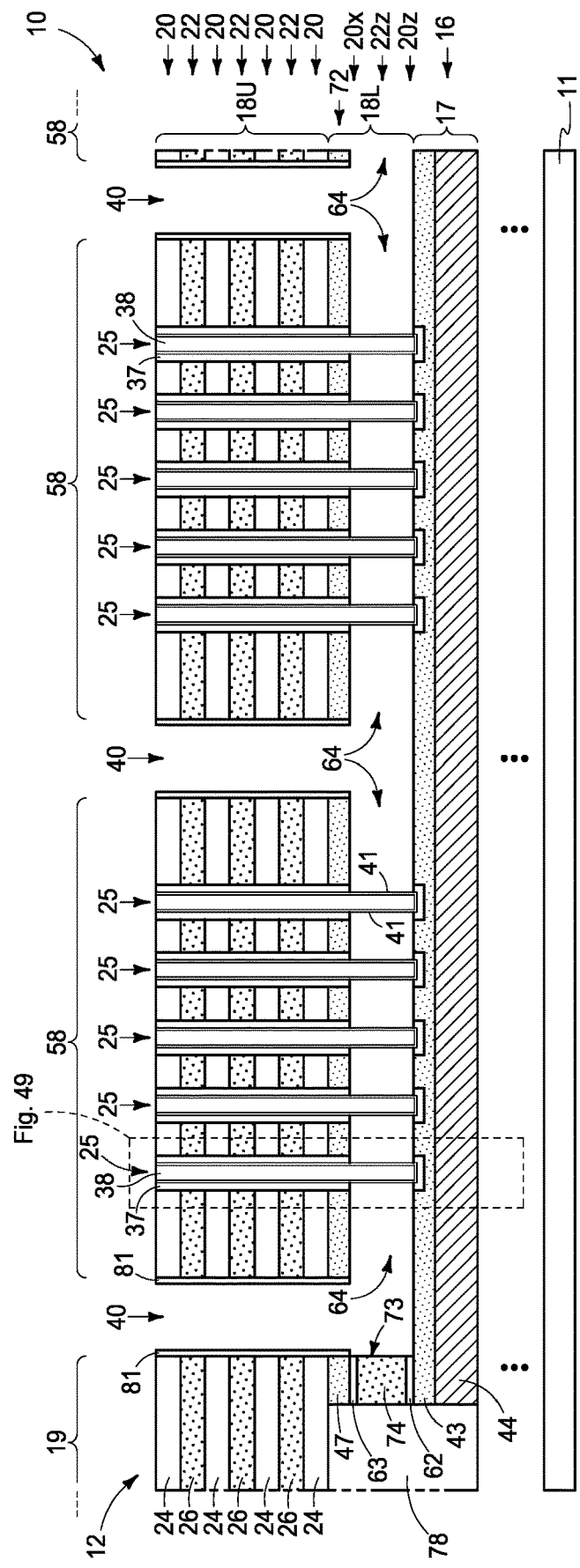
Figure 49:
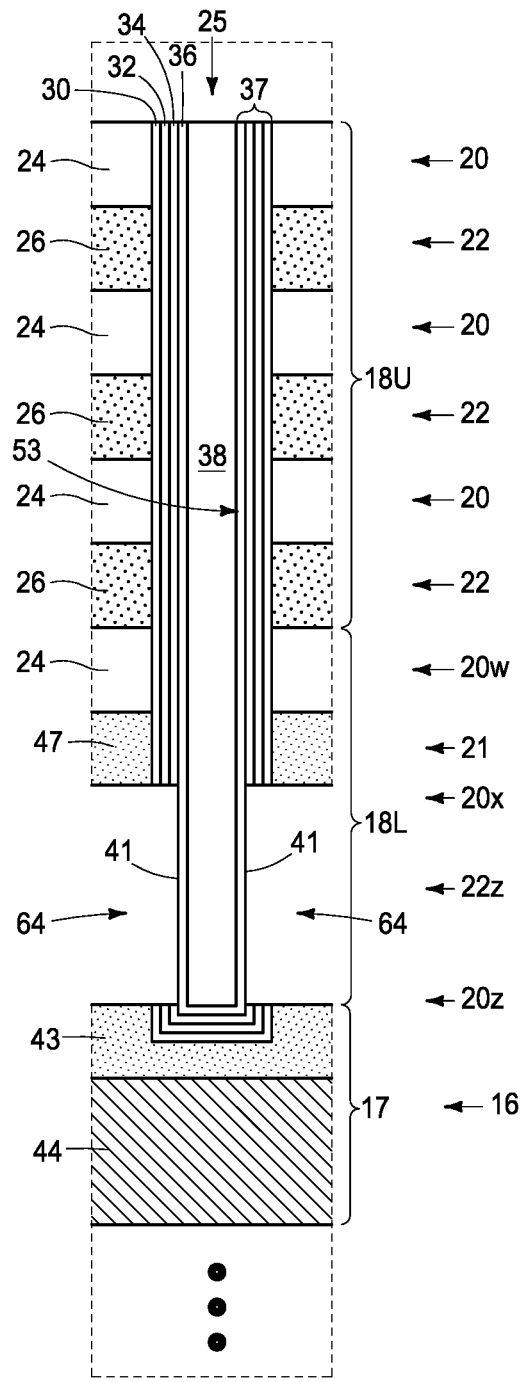
Figure 50:
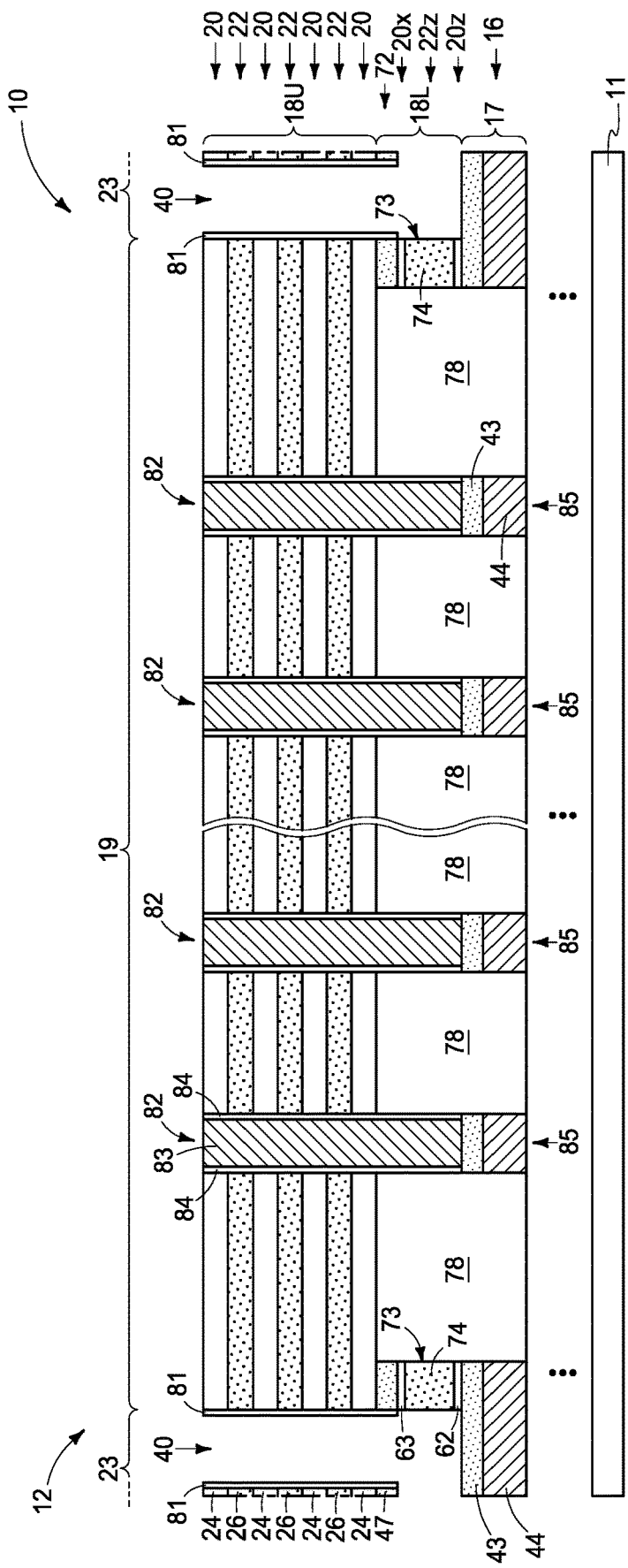
Figure 51:
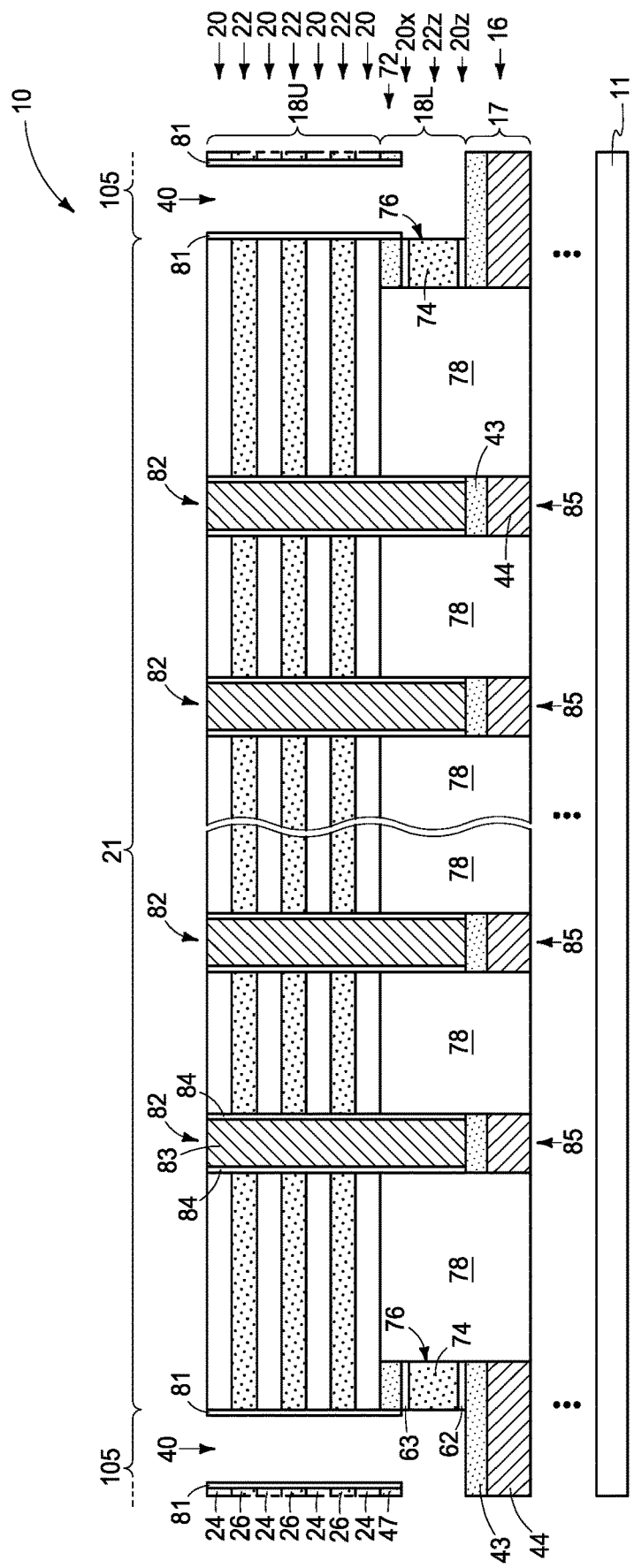
Figure 52:
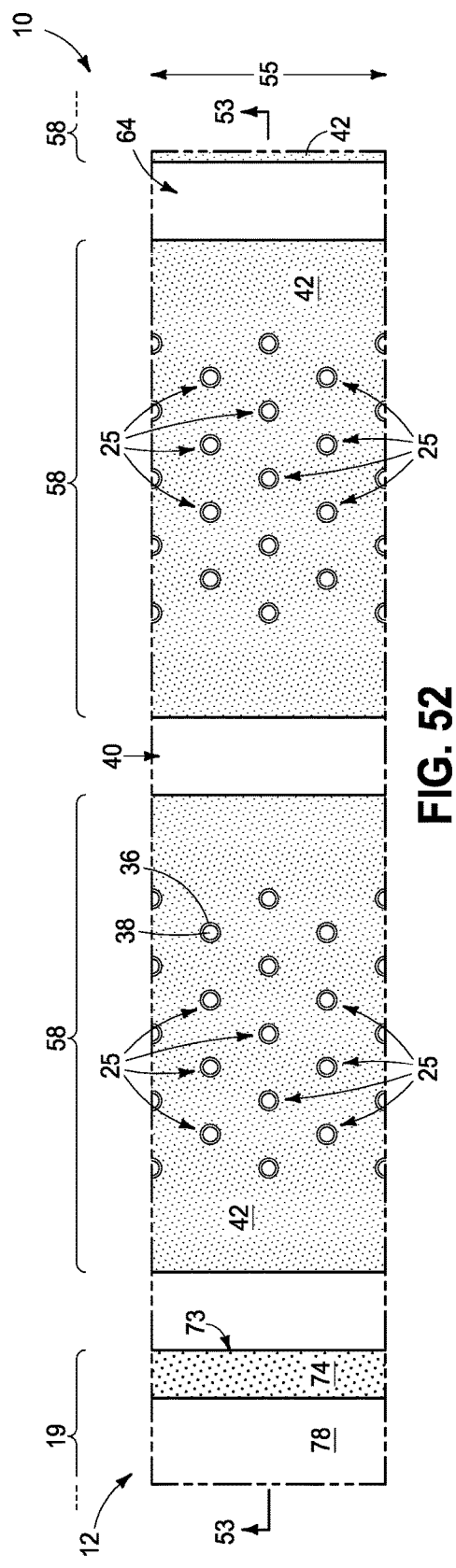
Figure 53:
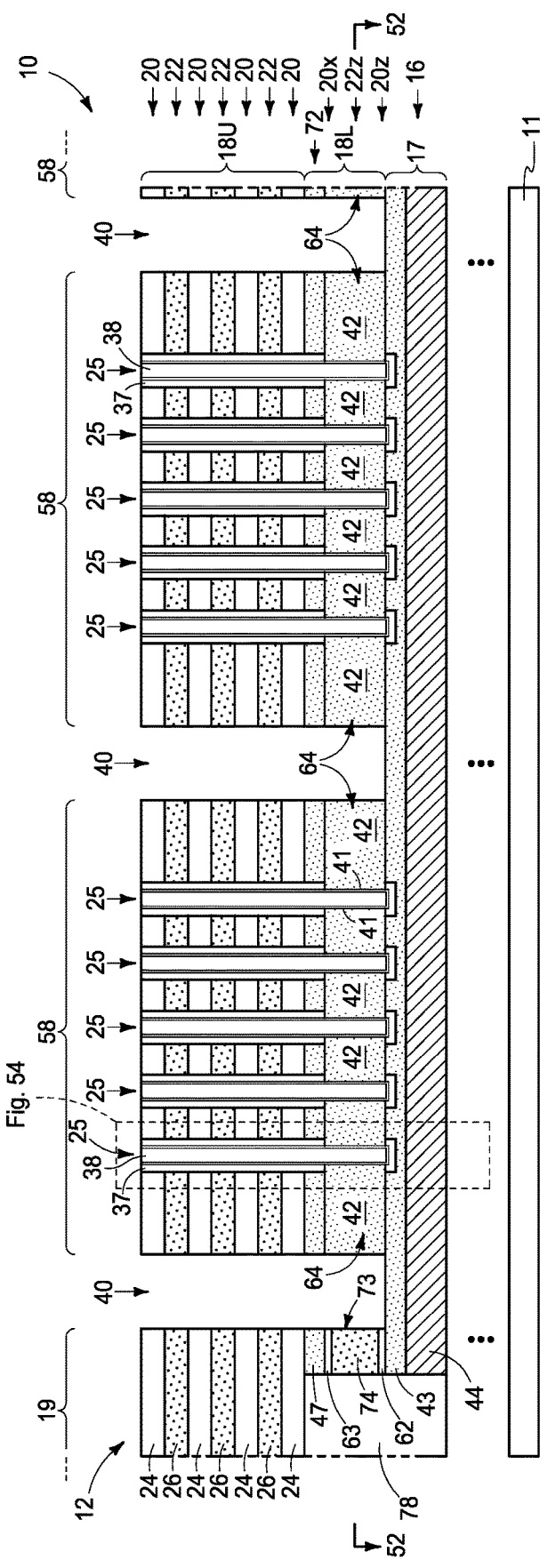
Figure 54:
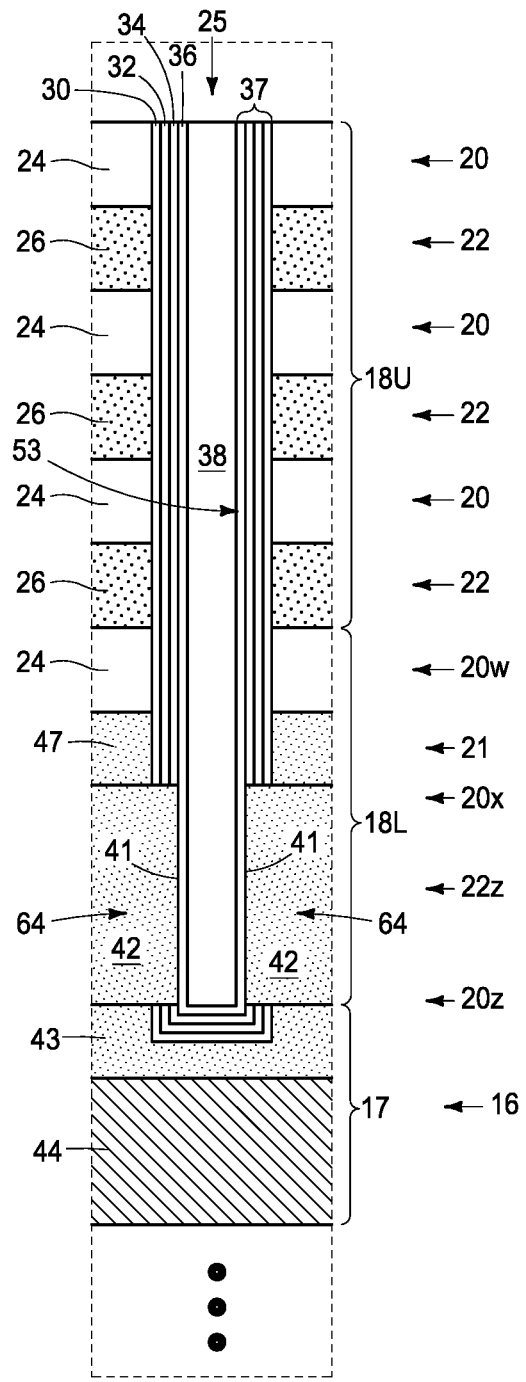
Figure 55:
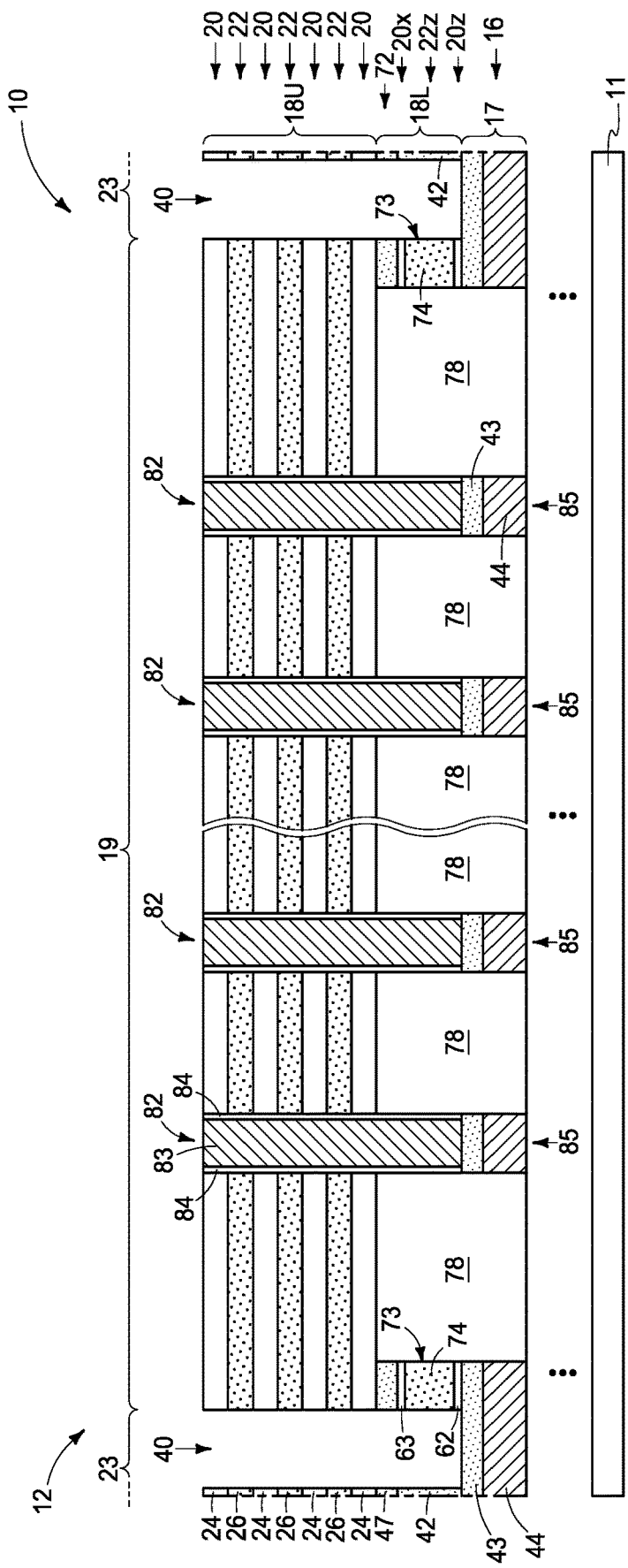
Figure 56:
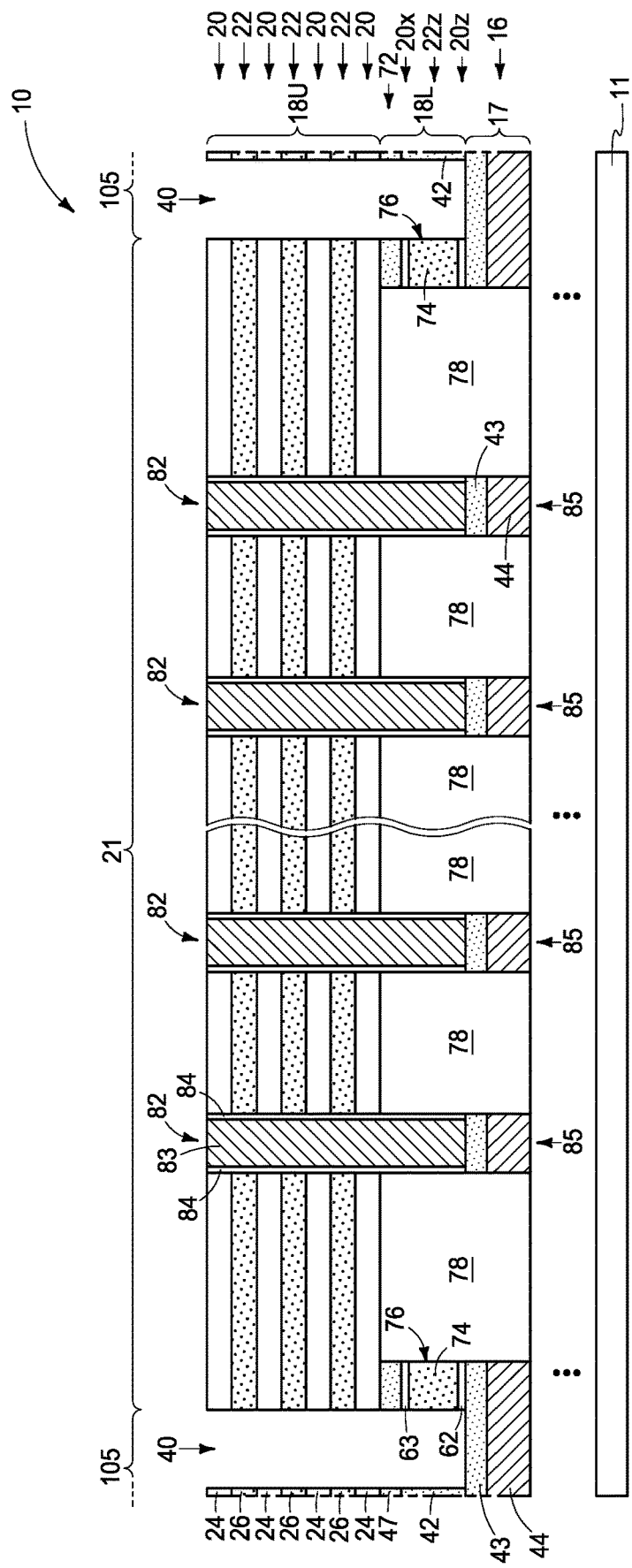
Figure 57:
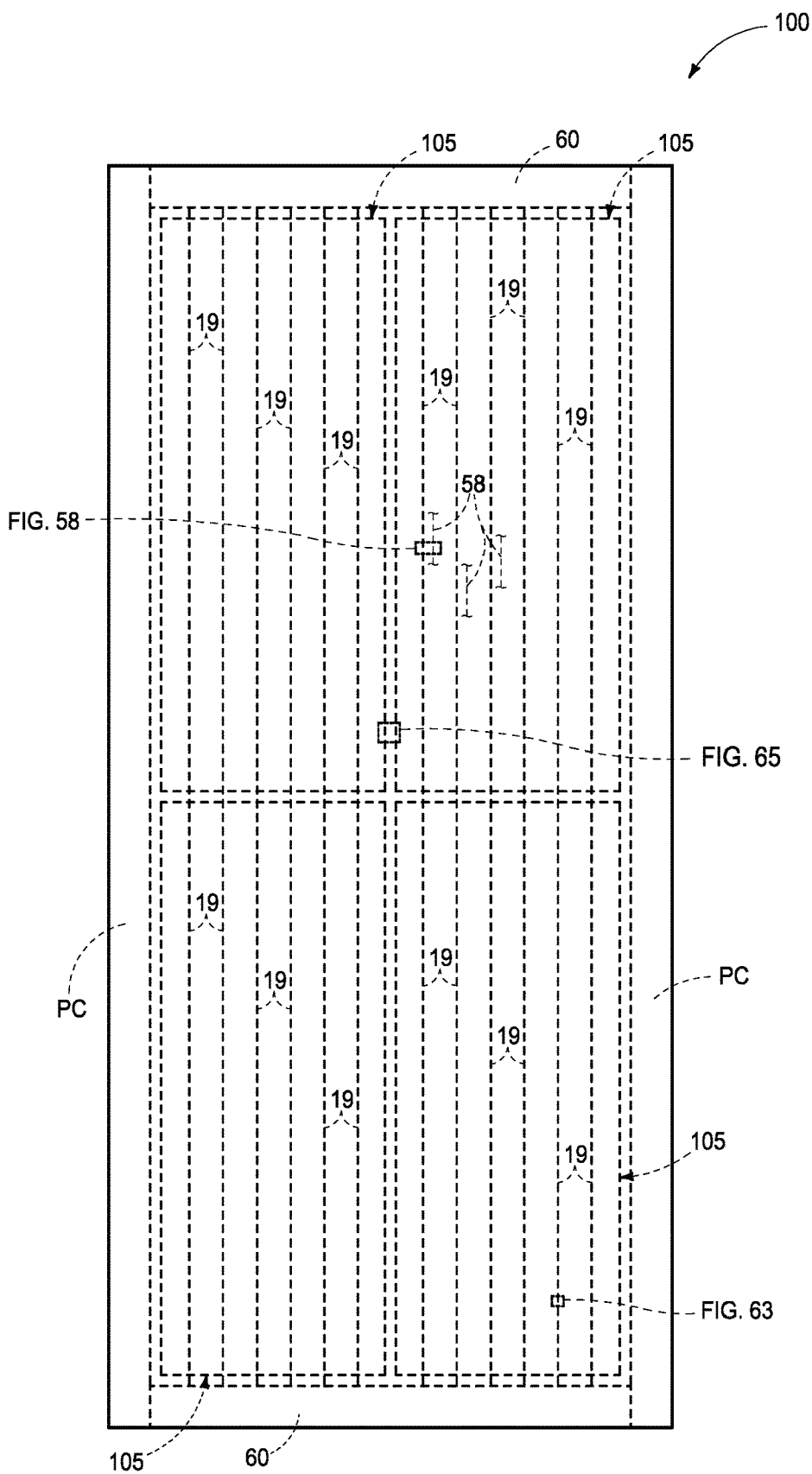
Figure 60:
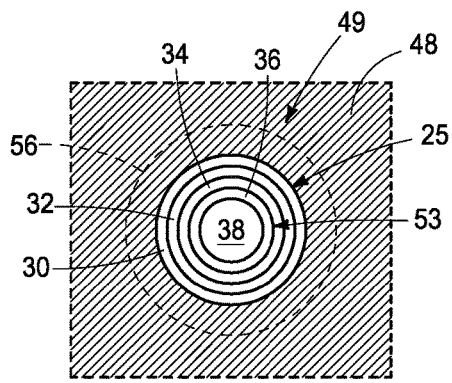
Figure 61:
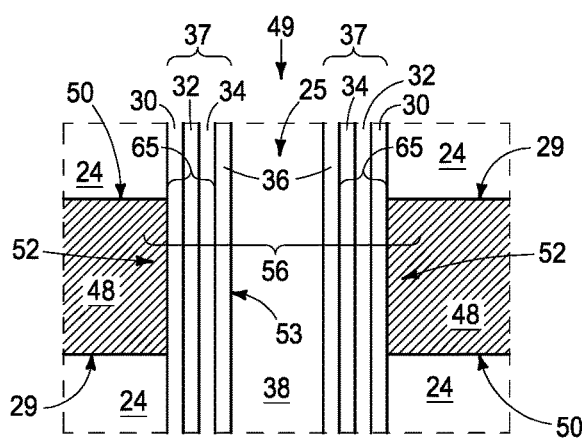
Figure 62:
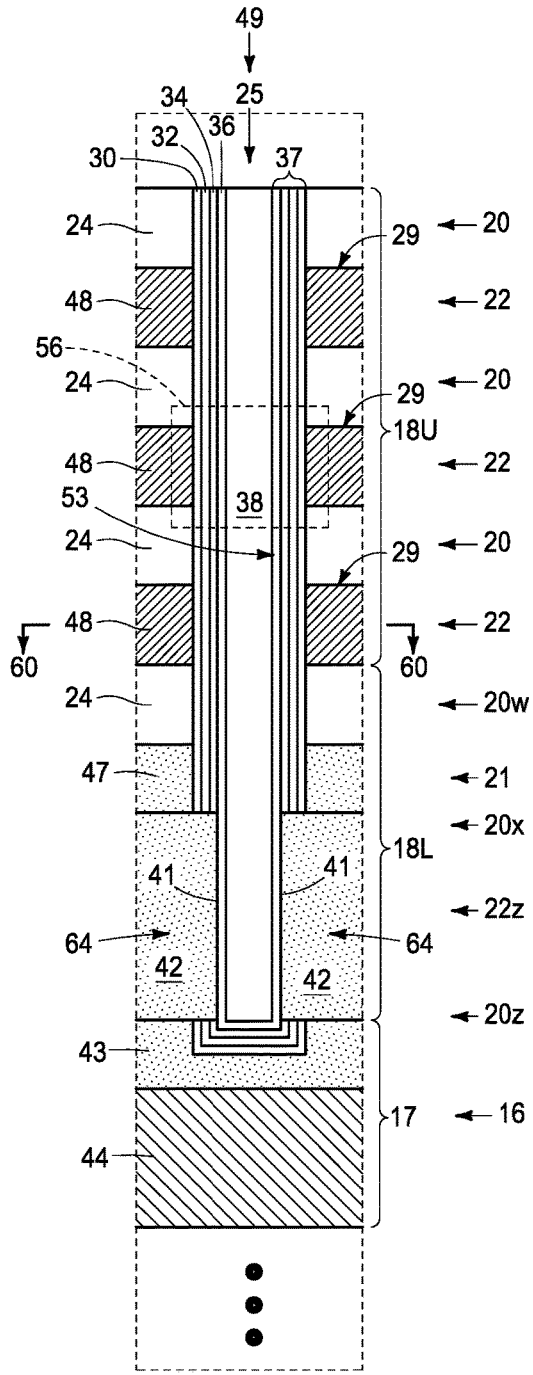
Figure 63:
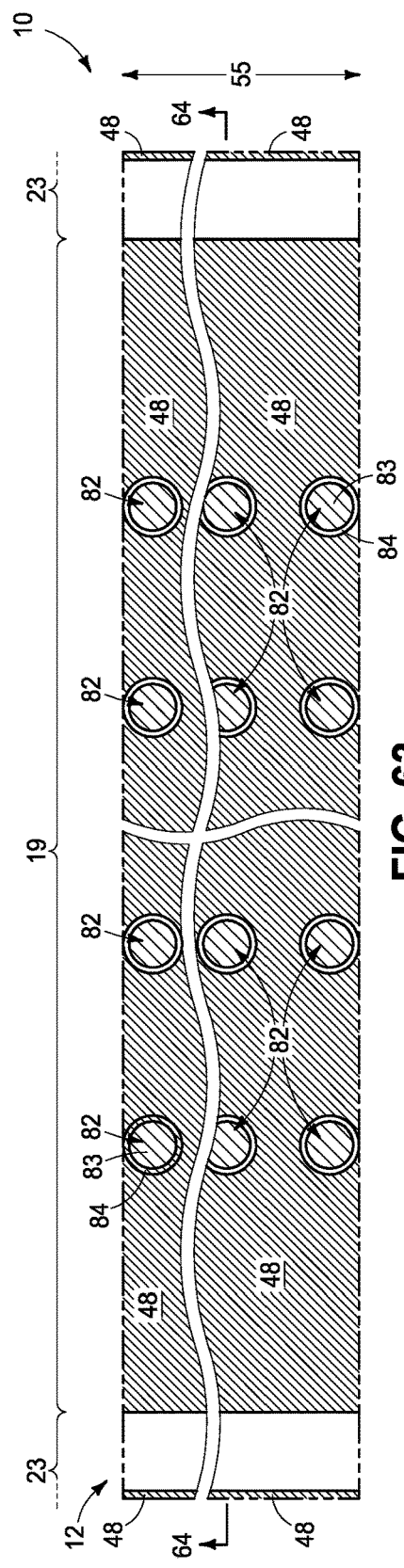
Figure 64:
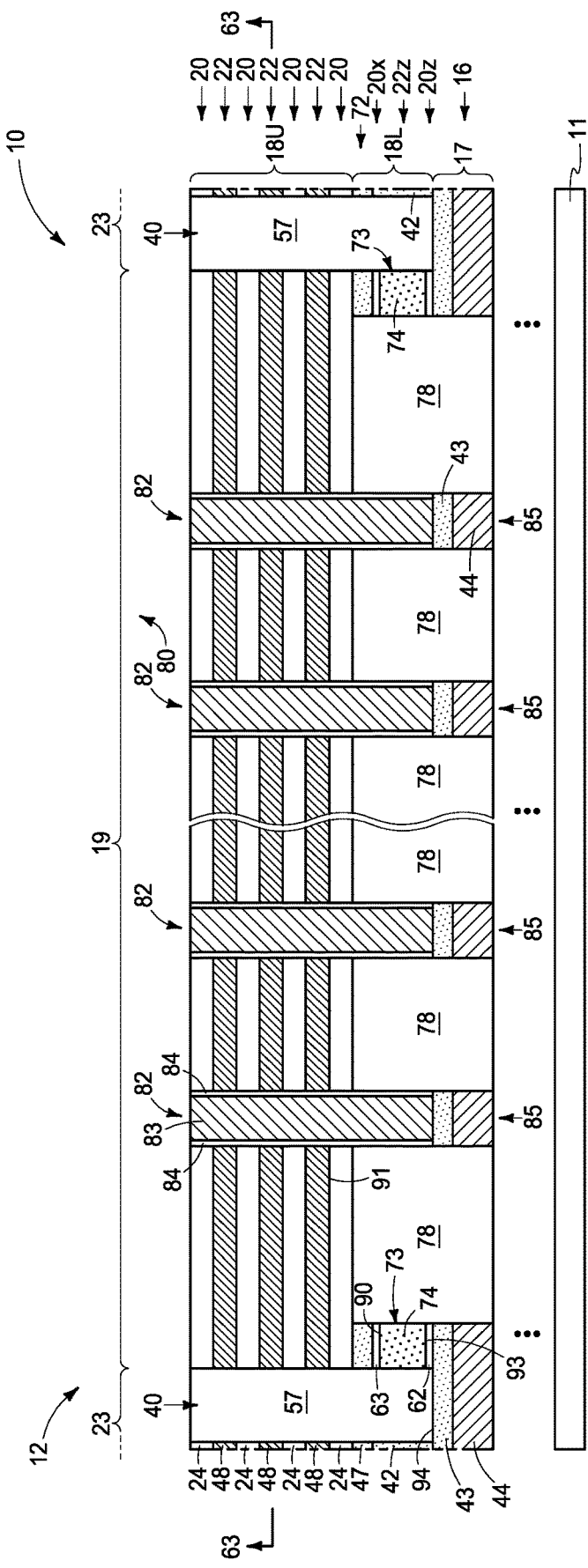

Referring to FIGS. 31-34, example TAVs 82 have been formed in TAV regions 19 and 21 to extend to conductor material 17 of conductor tier 16 (e.g., through materials 47, 63, 77, and 62 of islands/island locations 85 as shown in FIGS. 28 and 30). TAVs 82 are shown as extending to stop on conductor material 43 and alternately could extend to conductor material 44. Example TAVs are shown as comprising conductive material 83 (e.g., a TiN lining having a W core, and not shown) and insulator lining 84 (e.g., silicon dioxide and/or silicon nitride).

Referring to FIGS. 35-40, horizontally-elongated trenches 40 have been formed (e.g., by anisotropic etching) into stack 18* through upper portion 18U and that extend through next-lowest second tier 20x to sacrificial material 77 of lowest first tier 22z. Trenches 40 are individually between immediately-laterally-adjacent memory-block regions 58. Trenches 40 may taper laterally-inward in vertical cross-section moving deeper into stack 18. By way of example and for brevity only, channel openings 25 are shown as being arranged in groups or columns of staggered rows of four and five channel openings 25 per row. Trenches 40 will typically be wider than channel openings 25 (e.g., 10 to 20 times wider, yet such wider degree not being shown for brevity). Any alternate existing or future-developed arrangement and construction may be used. Trenches 40 and channel openings 25 may be formed in any order relative the other or at the same time.

Trenches 40 as shown have been formed to extend to material 77 of lowest first tier 22z. As one example, trenches 40 may initially be formed by etching materials 24, 26, and 47 (likely using different anisotropic etching chemistries) and that stops on or within material 63 of next-lowest second tier 20x. A thin sacrificial liner 81 (e.g., hafnium oxide, aluminum oxide, multiple layers of silicon dioxide and silicon nitride, etc.) may then be formed, followed by punch-etching there-through to expose material 63, and followed by punch-etching through material 63 to expose material 77. Alternately, and by way of example only, a sacrificial etch-stop line (not shown) having the same general horizontal outline as trenches 40 may individually be formed in conducting tier 72 (when present) directly above and in contact with material 63 of next-lowest second tier 20x before forming upper portion 18U. Trenches 40 may then be formed by etching materials 24 and 26 to stop on or within the material of the individual sacrificial lines, followed by exhuming remaining material of such sacrificial lines prior to forming thin sacrificial liner 81. One or more trenches 40 may be formed directly against one or both of TAV regions 19 and 21 (as shown) including, for example, partially there-within (not shown). Alternately, trenches 40 that are closest to TAV regions 19 and/or 21 may be laterally spaced therefrom (not shown).

Ultimately, through horizontally-elongated trenches 40, sacrificial material 77 in lowest first tier 22z is isotropically etched selectively relative to the wall (e.g., at least one of walls 73, 76 when both are present and ideally relative to both walls 73, 76 when present). Sacrificial material 77 is replaced with conductive material that directly electrically couples together channel material 36 of channel-material strings 53 and conductor material 17 of conductor tier 16. Example methods of doing so are described with reference to FIGS. 41-66.

Referring to FIGS. 41-47, material 77 (not shown) has been isotropically etched from lowest first tier 22z through trenches 40 selectively relative to walls 73, 76, thus leaving or forming a void space 64 vertically between lowest second tier 20z and next-lowest second tier 20x. Such may occur, for example, by isotropic etching that is ideally conducted selectively relative to materials 62 and 63, for example using liquid or vapor $H_3PO_4$ as a primary etchant where material 77 is silicon nitride or using tetramethyl ammonium hydroxide [TMAH] where material 77 is polysilicon. Such chemistries will also etch sacrificial material 77 selectively relative to example materials of walls 73, 76 as described above. The artisan is capable of selecting other chemistries for other materials 77 and/or walls 73, 76. In one embodiment, selectivity of the isotropically etching of sacrificial material 77 relative to wall 73 and/or 76 is at least 10:1.

FIGS. 48-51 show example subsequent processing wherein, in one embodiment, material 30 (e.g., silicon dioxide), material 32 (e.g., silicon nitride), and material 34 (e.g., silicon dioxide or a combination of silicon dioxide and silicon nitride) have been etched in tier 22z to expose a sidewall 41 of channel material 36 of channel-material strings 53 in lowest first tier 22z. Any of materials 30, 32, and 34 in tier 22z may be considered as being sacrificial material therein. As an example, consider an embodiment where liner 81 is one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example depicted construction. In one embodiment and as shown, such etching has been conducted selectively relative to liner 81 (when present). FIGS. 48-51, and in one embodiment, also show materials 62 and 63 (not shown) as having been removed from memory-block regions 58. When so removed, such may be removed when removing materials 30, 32, and 34 are removed, for example if materials 62 and 63 comprise one or both of silicon dioxide and silicon nitride. Alternately, when so removed, such may be removed separately (e.g., by isotropic etching). The artisan is capable of selecting other chemistries for etching other different materials where a construction as shown is desired.

Referring to FIGS. 52-56, conducting material 42 (e.g., conductively-doped polysilicon) has been formed in lowest first tier 22z and in one embodiment directly against sidewall 41 of channel material 36. In one embodiment and as shown, such has been formed directly against a bottom of conducting material 47 of conducting tier 72 and directly against a top of conductor material 43 of conductor tier 16, thereby directly electrically coupling together channel material 36 of individual channel-material strings 53 with conductor material 43 of conductor tier 16 and conducting material 47 of conducting tier 72. Subsequently, and by way of example, conducting material 42 has been removed from trenches 40 as has sacrificial liner 81 (not shown). Sacrificial liner 81 may be removed before (as shown) or after forming conducting material 42 (not shown). In one embodiment, during the replacing of sacrificial material 77 (not shown) with conducting material 42, the wall at least in part precludes any of conducting material 42 from being directly against any TAV (e.g., TAVs 82) that is in the TAV region of the one of the (a) and the (b) where the wall is in (e.g., regardless of presence of insulator material 78).

Heretofore, isotropic etching through trenches 40 to remove materials in lowest first tier 22z to expose channel-material sidewalls 41 in memory-block regions 58 may also etch material in TAV regions 19 and 21 (e.g., material 78) to the point of exposing some edge TAVs 82 that can lead to fatal shorts. Presence of a wall 73 and/or 76 may eliminate or at least reduce such risk.

Referring to FIGS. 57-66, material 26 (not shown) of conductive tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Some, all, or none of material 26 (all being shown) may be removed from TAV region 19 and/or 21, for example depending on proximity of trenches 40 that are closest thereto and/or presence or lack thereof of other etch-blocking material(s)/structure(s) in tiers 22 in upper portion 18U (not shown).

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In this document, "undoped" is a material having from 0 atoms/cm$^3$ to $1\times10^{12}$ atoms/cm$^3$ of atoms of conductivity-increasing impurity in said material. In this document, "doped" is a material having more than $1\times10^{12}$ atoms/cm$^3$ of atoms of conductivity-increasing impurity therein and "conductively-doped" is material having at least $1\times10^{18}$ atoms/cm$^3$ of atoms of conductivity-increasing impurity therein. Intervening material 57 may include through array vias (not shown).

Any other attribute(s) or aspect(s) as shown and/or described herein with respect to other embodiments may be used in the embodiments shown and described with reference to the above embodiments.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*) above a conductor tier (e.g., 16). Strings of memory cells comprise channel-material strings (e.g., 53) that extend through the insulative tiers and the conductive tiers. The channel-material strings directly electrically couple with conductor material (e.g., 17) of the conductor tier by conducting material (e.g., 42) that is in a lowest of the conductive tiers (e.g., 22z) and that is directly against multiple of the channel-material strings. The channel-material strings in the laterally-spaced memory blocks comprise part of a memory plane (e.g., 105). A wall (e.g., 73) is in the lowest conductive tier aside the conducting material. The wall is horizontally-elongated in the memory plane longitudinally-along one of the memory blocks. The one memory block is immediately-adjacent a TAV region (e.g., 19) that is in the memory plane. The wall is along an edge (e.g., 79) of the one memory block that is closest to the TAV region that is in the memory plane.

In one embodiment, the wall has a top (e.g., 90) that is at or below a bottom (e.g., 91) of a next-lowest conductive tier that is directly above the lowest conductive tier. In one embodiment, the wall has a bottom (e.g., 93) that is at or above a top (e.g., 94) of the conductor tier. In one embodiment, the wall is along all of the edge of the one memory block region that is closest to the TAV region. In one embodiment, the memory blocks are elongated horizontally-parallel relative one another and the wall is horizontally-elongated parallel the memory blocks. In one embodiment, the wall is insulative and one side thereof is directly against the conducting material in the lowest conductive tier that directly electrically couples the multiple channel-material strings with the conductor material of the conductor tier. In one such latter embodiment, another side of the wall that is laterally-opposite the one side is directly against insulative material that is in the TAV region.

Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*) above a conductor tier (e.g., 16). Strings of memory cells comprise channel-material strings (e.g., 53) that extend through the insulative tiers and the conductive tiers. The channel-material strings directly electrically couple with conductor material (e.g., 17) of the conductor tier by conducting material (e.g., 42) that is in a lowest of the conductive tiers (e.g., 22z) and that is directly against multiple of the channel-material strings. The channel-material strings in the laterally-spaced memory blocks comprise part of a memory plane (e.g., 105). A wall (e.g., 76) is in the lowest conductive tier aside the conducting material. The wall is in a region that is edge-of-plane relative to the memory plane. The edge-of-plane region comprise a TAV region (e.g., 21). The wall is horizontally-elongated relative to an edge of the TAV region that is in the edge-of-plane region. In one embodiment, the wall is along all of the edge of the TAV region and in one such embodiment the memory blocks are elongated horizontally-parallel relative one another and the wall is horizontally-elongated parallel the memory blocks. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a conductor tier comprising conductor material on a substrate. A lower portion of a stack is formed that will comprise vertically-alternating first tiers and second tiers above the conductor tier. The stack comprises laterally-spaced memory-block regions. The memory-block regions comprise part of a memory-plane region. The lower portion comprises a lowest of the first tiers that comprises sacrificial material. A wall is formed in the lowest first tier aside the sacrificial material. The wall is of different composition from that of the sacrificial material and is horizontally-elongated. The wall is one of (a) or (b), where: (a): in the memory-plane region longitudinally-along one of the memory-block regions, the one memory-block region being immediately-adjacent a through-array-via (TAV) region that is in the memory-plane region, the wall being along an edge of the one memory-block region that is closest to the TAV region that is in the memory-plane region, and (b): in a region that is edge-of-plane relative to the memory-plane region, the edge-of-plane region comprising a TAV region, the wall being horizontally-elongated relative to an edge of the TAV region that is in the edge-of-plane region. After forming the wall, the vertically-alternating different-composition first tiers and second tiers of an upper portion of the stack are formed above the lower portion. Channel-material strings are formed that extend through the first tiers and the second tiers in the upper portion to the lower portion. Horizontally-elongated trenches are formed through the upper portion and that are individually between immediately-laterally-adjacent of the memory-block regions. Through the horizontally-elongated trenches, the sacrificial material is isotropically etched selectively relative to the wall and the sacrificial material is replaced with conducting material that directly electrically couples together channel material of the channel-material strings and the conductor material of the conductor tier.

In some embodiments, a memory array comprising strings of memory cells comprising laterally-spaced memory blocks individually comprise a vertical stack comprising alternating insulative tiers and conductive tiers above a conductor tier. Strings of memory cells comprise channel-material strings that extend through the insulative tiers and the conductive tiers. The channel-material strings directly electrically couple with conductor material of the conductor tier by conducting material that is in a lowest of the conductive tiers and that is directly against multiple of the channel-material strings. The channel-material strings in the laterally-spaced memory blocks comprise part of a memory plane. A wall in the lowest conductive tier is aside the conducting material. The wall is horizontally-elongated in the memory plane longitudinally-along one of the memory blocks. The one memory block is immediately-adjacent a through-array-via (TAV) region that is in the memory plane. The wall is along an edge of the one memory block that is closest to the TAV region that is in the memory plane.

In some embodiments, a memory array comprising strings of memory cells comprises laterally-spaced memory blocks individually comprising a vertical stack comprising alternating insulative tiers and conductive tiers above a conductor tier. Strings of memory cells comprise channel-material strings that extend through the insulative tiers and the conductive tiers. The channel-material strings directly electrically couple with conductor material of the conductor tier by conducting material that is in a lowest of the conductive tiers and that is directly against multiple of the channel-material strings. The channel-material strings in the laterally-spaced memory blocks comprise part of a memory plane. A wall in the lowest conductive tier is aside the conducting material. The wall is in a region that is edge-of-plane relative to the memory plane. The edge-of-plane region comprises a TAV region. The wall is horizontally-elongated relative to an edge of the TAV region that is in the edge-of-plane region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
forming a conductor tier comprising conductor material on a substrate;
forming a lower portion of a stack that will comprise vertically-alternating first tiers and second tiers above the conductor tier, the stack comprising laterally-spaced memory-block regions, the memory-block regions comprising part of a memory-plane region, the lower portion comprising a lowest of the first tiers that comprises sacrificial material;

forming a wall in the lowest first tier aside the sacrificial material, the wall being of different composition from that of the sacrificial material and being horizontally-elongated, the wall being one of (a) or (b), where:
- (a): in the memory-plane region longitudinally-along one of the memory-block regions, the one memory-block region being immediately-adjacent a through-array-via (TAV) region that is in the memory-plane region, the wall being along an edge of the one memory-block region that is closest to the TAV region that is in the memory-plane region; and
- (b): in a region that is edge-of-plane relative to the memory-plane region, the edge-of-plane region comprising a TAV region, the wall being horizontally-elongated relative to an edge of the TAV region that is in the edge-of-plane region;

after forming the wall, forming the vertically-alternating different-composition first tiers and second tiers of an upper portion of the stack above the lower portion, and forming channel-material strings that extend through the first tiers and the second tiers in the upper portion to the lower portion;

forming horizontally-elongated trenches through the upper portion and that are individually between immediately-laterally-adjacent of the memory-block regions; and through the horizontally-elongated trenches, isotropically etching the sacrificial material selectively relative to the wall and replacing the sacrificial material with conducting material that directly electrically couples together channel material of the channel-material strings and the conductor material of the conductor tier.

2. The method of claim 1 comprising the (a).

3. The method of claim 2 wherein the wall is along all of the edge of the one memory-block region that is closest to the TAV region that is in the memory-plane region.

4. The method of claim 1 comprising the (b).

5. The method of claim 4 wherein the wall is along all of the edge of the TAV region that is in the edge-of-plane region.

6. The method of claim 1 comprising another of said wall in the other of the (a) or the (b).

7. The method of claim 1 wherein the wall is insulative.

8. The method of claim 1 wherein the memory-block regions are elongated horizontally-parallel relative one another, the wall being horizontally-elongated parallel the memory-block regions.

9. The method of claim 1 wherein the wall is directly against the sacrificial material.

10. The method of claim 9 wherein the wall and sacrificial material have the same thickness at an interface thereof.

11. The method of claim 1 wherein the wall and the sacrificial material comprise a same primary material, the same primary material of the wall being doped with a substance, the same primary material of the sacrificial material comprising less, if any, of the substance than does the same primary material of the wall.

12. The method of claim 11 wherein the primary material is polysilicon and the substance is one of B, C, O, or N.

13. The method of claim 1 comprising etching completely through a portion of the wall to reduce its width prior to forming the upper portion.

14. The method of claim 1 wherein forming the wall comprises:

forming a mask opening in masking material that is directly above the sacrificial material; and one of ion implanting, plasma doping, or diffusion doping a substance through the mask opening into the sacrificial material directly there-below.

15. The method of claim 14 wherein, the mask opening has a horizontal longitudinal outline the same as what-will-be the wall in a finished circuitry construction, the horizontal longitudinal of the mask opening being wider than what-will-be the wall in the finished circuitry construction, the one of ion implanting, plasma doping, or diffusion doping forming an initial wall that is wider than the wall in the finished circuitry construction; and further comprising etching completely through a portion of the initial wall to reduce its width after the one of ion implanting, plasma doping, or diffusion doping and prior to forming the upper portion.

16. The method of claim 1 wherein forming the wall comprises:

forming a mask opening in masking material that is directly above the sacrificial material;

etching through the mask opening to form a horizontally-elongated wall-trench through the sacrificial material;

overfilling the wall-trench with material of the wall; and removing the material of the wall back to at least a top surface of the sacrificial material.

17. The method of claim 1 wherein selectivity of the isotropically etching of the sacrificial material relative to the wall is at least 10:1.

18. The method of claim 1 wherein, during said replacing, the wall at least in part precludes any of the conducting material from being directly against any TAV that is in the TAV region of the one of the (a) and the (b) where the wall is in.

19. The method of claim 1 wherein, in a finished construction, one side of the wall is directly against the conducting material and another side of the wall is directly against insulator material that is in the TAV region of the one of the (a) and the (b) where the wall is in.

20. A memory array comprising:

laterally-spaced memory blocks individually comprising a vertical stack comprising alternating insulative tiers and conductive tiers above a conductor tier, strings of memory cells comprising channel-material strings that extend through the insulative tiers and the conductive tiers, the channel-material strings directly electrically coupling with conductor material of the conductor tier by conducting material that is in a lowest of the conductive tiers and that is directly against multiple of the channel-material strings, the channel-material strings in the laterally-spaced memory blocks comprising part of a memory plane; and a wall in the lowest conductive tier aside the conducting material, the wall being horizontally-elongated in the memory plane longitudinally-along one of the memory blocks, the one memory block being immediately-adjacent a through-array-via (TAV) region that is in the memory plane, the wall being along an edge of the one memory block that is closest to the TAV region that is in the memory plane.

21. The memory array of claim 20 wherein the wall has a top that is at or below a bottom of a next-lowest conductive tier that is directly above the lowest conductive tier.

22. The memory array of claim 20 wherein the wall has a bottom that is at or above a top of the conductor tier.

23. The memory array of claim 20 wherein,
the wall has a top that is at or below a bottom of a next-lowest conductive tier that is directly above the lowest conductive tier; and
the wall has a bottom that is at or above a top of the conductor tier.

24. The memory array of claim 20 wherein the wall is along all of the edge of the one memory block region that is closest to the TAV region.

25. The memory array of claim 20 wherein the memory blocks are elongated horizontally-parallel relative one another, the wall being horizontally-elongated parallel the memory blocks.

26. The memory array of claim 20 wherein the wall is insulative and one side thereof is directly against the conducting material in the lowest conductive tier that directly electrically couples the multiple channel-material strings with the conductor material of the conductor tier.

27. The memory array of claim 26 wherein another side of the wall that is laterally-opposite the one side is directly against insulative material that is in the TAV region.

28. A memory array comprising:
laterally-spaced memory blocks individually comprising a vertical stack comprising alternating insulative tiers and conductive tiers above a conductor tier, strings of memory cells comprising channel-material strings that extend through the insulative tiers and the conductive tiers, the channel-material strings directly electrically coupling with conductor material of the conductor tier by conducting material that is in a lowest of the conductive tiers and that is directly against multiple of the channel-material strings, the channel-material strings in the laterally-spaced memory blocks comprising part of a memory plane; and
a wall in the lowest conductive tier aside the conducting material, the wall being in a region that is edge-of-plane relative to the memory plane, the edge-of-plane region comprising a TAV region, the wall being horizontally-elongated relative to an edge of the TAV region that is in the edge-of-plane region.

29. The memory array of claim 28 wherein the wall has a top that is at or below a bottom of a next-lowest conductive tier that is directly above the lowest conductive tier.

30. The memory array of claim 28 wherein the wall has a bottom that is at or above a top of the conductor tier.

31. The memory array of claim 28 wherein,
the wall has a top that is at or below a bottom of a next-lowest conductive tier that is directly above the lowest conductive tier; and
the wall has a bottom that is at or above a top of the conductor tier.

32. The memory array of claim 28 wherein the wall is along all of the edge of the TAV region.

33. The memory array of claim 32 wherein the wall is along all of an edge of the memory plane.

34. The memory array of claim 28 wherein the memory blocks are elongated horizontally-parallel relative one another, the wall being horizontally-elongated parallel the memory blocks.

35. The memory array of claim 28 wherein the wall is insulative and one side thereof is directly against the conducting material in the lowest conductive tier that directly electrically couples the multiple channel-material strings with the conductor material of the conductor tier in the memory plane.

36. The memory array of claim 35 wherein another side of the wall that is laterally-opposite the one side is directly against insulative material that is in the TAV region.

* * * * *